US007362784B2

(12) United States Patent
Yamazaki et al.

(10) Patent No.: US 7,362,784 B2
(45) Date of Patent: *Apr. 22, 2008

(54) LASER IRRADIATION METHOD, LASER IRRADIATION APPARATUS, AND SEMICONDUCTOR DEVICE

(75) Inventors: Shunpei Yamazaki, Tokyo (JP); Koichiro Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/504,575

(22) Filed: Aug. 15, 2006

(65) Prior Publication Data
US 2007/0037331 A1 Feb. 15, 2007

Related U.S. Application Data

(63) Continuation of application No. 11/189,399, filed on Jul. 26, 2005, now Pat. No. 7,095,762, which is a continuation of application No. 10/315,779, filed on Dec. 10, 2002, now Pat. No. 6,944,195, which is a continuation of application No. 09/500,247, filed on Feb. 8, 2000, now Pat. No. 6,535,535.

(30) Foreign Application Priority Data

Feb. 12, 1999 (JP) ................... 11-035019
Feb. 18, 1999 (JP) ................... 11-039787

(51) Int. Cl.
*H01S 3/13* (2006.01)
(52) U.S. Cl. ............ 372/29.014; 372/43.01; 372/50.01; 372/29.021; 372/19
(58) Field of Classification Search ......... 372/29.014, 372/15, 43.01, 39, 7, 19, 29.021; 438/166, 438/479
See application file for complete search history.

(56) References Cited

U.S. PATENT DOCUMENTS 4,711,026 A 12/1987 Swiggett et al. ............ 29/850

(Continued)

FOREIGN PATENT DOCUMENTS

| EP | 0 820 132 A2 | 1/1998 |
| JP | 07-130652 | 5/1995 |
| JP | 10-163547 | 6/1998 |

OTHER PUBLICATIONS

Yoshida, T. et al, "A Full Color Thresholdless Antiferroelectric LCD Exhibiting Wide Viewing Angle with Fast Response Time," SID 97 Digest, pp. 841-844, (1997).

(Continued)

*Primary Examiner*—Minsun Oh Harvey
*Assistant Examiner*—Delma R. Flore Ruiz
(74) *Attorney, Agent, or Firm*—Cook, Alex, McFarron, Manzo, Cummings & Mehler, Ltd.

(57) ABSTRACT

An object of the present invention is obtaining a semiconductor film with uniform characteristics by improving irradiation variations of the semiconductor film. The irradiation variations are generated due to scanning while irradiating with a linear laser beam of the pulse emission. At a laser crystallization step of irradiating a semiconductor film with a laser light, a continuous light emission excimer laser emission device is used as a laser light source. For example, in a method of fabricating an active matrix type liquid crystal display device, a continuous light emission excimer laser beam is irradiated to a semiconductor film, which is processed to be a linear shape, while scanning in a vertical direction to the linear direction. Therefore, more uniform crystallization can be performed because irradiation marks can be avoided by a conventional pulse laser.

30 Claims, 22 Drawing Sheets

U.S. PATENT DOCUMENTS

| | | | |
|---|---|---|---|
| 5,313,075 A | 5/1994 | Zhang et al. | 257/57 |
| 5,576,231 A | 11/1996 | Konuma et al. | 437/41 |
| 5,581,102 A | 12/1996 | Kusumoto | 257/347 |
| 5,594,569 A | 1/1997 | Konuma et al. | 349/122 |
| 5,619,045 A | 4/1997 | Konuma et al. | 257/72 |
| 5,643,826 A | 7/1997 | Ohtani et al. | 437/88 |
| 5,756,364 A | 5/1998 | Tanaka et al. | 437/21 |
| 5,811,326 A | 9/1998 | Yamamoto | 438/163 |
| 5,815,494 A * | 9/1998 | Yamazaki et al. | 372/25 |
| 5,831,281 A | 11/1998 | Kurogane et al. | 257/57 |
| 5,841,102 A | 11/1998 | Noddin | 219/121 |
| 5,854,803 A | 12/1998 | Yamazaki et al. | 372/31 |
| 5,861,337 A | 1/1999 | Zhang et al. | 438/437 |
| 5,882,960 A | 3/1999 | Zhang et al. | 438/166 |
| 5,891,764 A | 4/1999 | Ishihara et al. | 438/151 |
| 5,895,933 A | 4/1999 | Zhang et al. | 257/49 |
| 5,907,770 A | 5/1999 | Yamazaki et al. | 438/149 |
| 5,923,962 A | 7/1999 | Ohtani et al. | 438/150 |
| 5,939,731 A | 8/1999 | Yamazaki et al. | 257/59 |
| 5,953,595 A | 9/1999 | Gosain et al. | 438/158 |
| 6,002,523 A | 12/1999 | Tanaka | 359/624 |
| 6,008,101 A | 12/1999 | Tanaka et al. | 438/308 |
| 6,031,249 A | 2/2000 | Yamazaki et al. | 257/66 |
| 6,054,739 A | 4/2000 | Yamazaki et al. | 257/347 |
| 6,093,935 A | 7/2000 | Kusumoto | 257/52 |
| 6,104,535 A | 8/2000 | Tanaka | 359/619 |
| 6,137,633 A | 10/2000 | Tanaka | 359/619 |
| 6,165,876 A | 12/2000 | Yamazaki et al. | 438/517 |
| 6,176,926 B1 | 1/2001 | Tanaka | 117/92 |
| 6,242,292 B1 | 6/2001 | Yamazaki et al. | 438/166 |
| 6,246,524 B1 | 6/2001 | Tanaka | 359/619 |
| 6,274,885 B1 | 8/2001 | Yamazaki et al. | 257/59 |
| 6,281,552 B1 | 8/2001 | Kawasaki et al. | 257/350 |
| 6,300,176 B1 | 10/2001 | Zhang et al. | 438/166 |
| 6,304,385 B1 | 10/2001 | Tanaka | 359/619 |
| 6,317,195 B1 | 11/2001 | Taniguchi | 355/53 |
| 6,324,195 B1 | 11/2001 | Suzuki et al. | 372/25 |
| 6,326,246 B1 | 12/2001 | Yamamoto | 438/166 |
| 6,393,042 B1 | 5/2002 | Tanaka | 372/101 |
| 6,501,098 B2 | 12/2002 | Yamazaki | 257/72 |
| 6,535,535 B1 | 3/2003 | Yamazaki et al. | 372/43 |
| 6,613,619 B2 | 9/2003 | Yamazaki et al. | 438/166 |
| 6,707,614 B2 | 3/2004 | Tanaka | 359/626 |
| 6,710,855 B2 | 3/2004 | Shiraishi | 355/67 |
| 6,750,423 B2 | 6/2004 | Tanaka et al. | 219/121.73 |
| 6,750,424 B2 | 6/2004 | Tanaka | 219/121 |
| 6,894,839 B2 | 5/2005 | Sugiyama et al. | 359/618 |
| 2002/0005888 A1* | 1/2002 | Obata et al. | 347/139 |
| 2002/0080841 A1* | 6/2002 | Yin et al. | 372/75 |
| 2002/0173147 A1* | 11/2002 | Miyasaka | 438/680 |
| 2003/0201442 A1* | 10/2003 | Makita | 257/66 |

OTHER PUBLICATIONS

Furue, H. et al, "Characteristics and Driving Scheme of Polymer-Stabilized Monostable FLCD Exhibiting Fast Response Time and High Contrast Ratio with Gray-Scale Capability," SID 98 Digest, pp. 782-785, (1998).

* cited by examiner

SCANNING DIRECTION

A                                         B

C                                         D

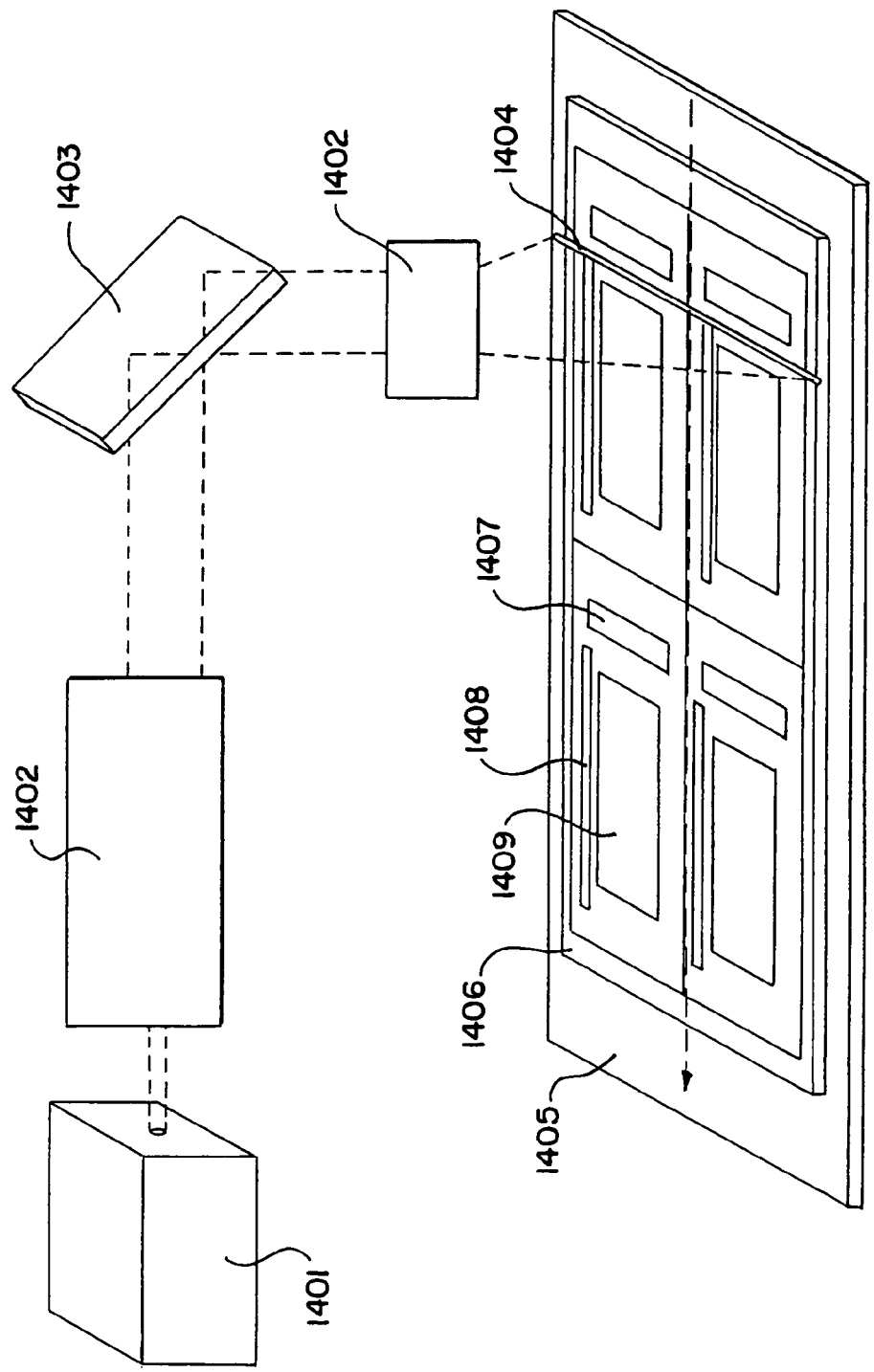

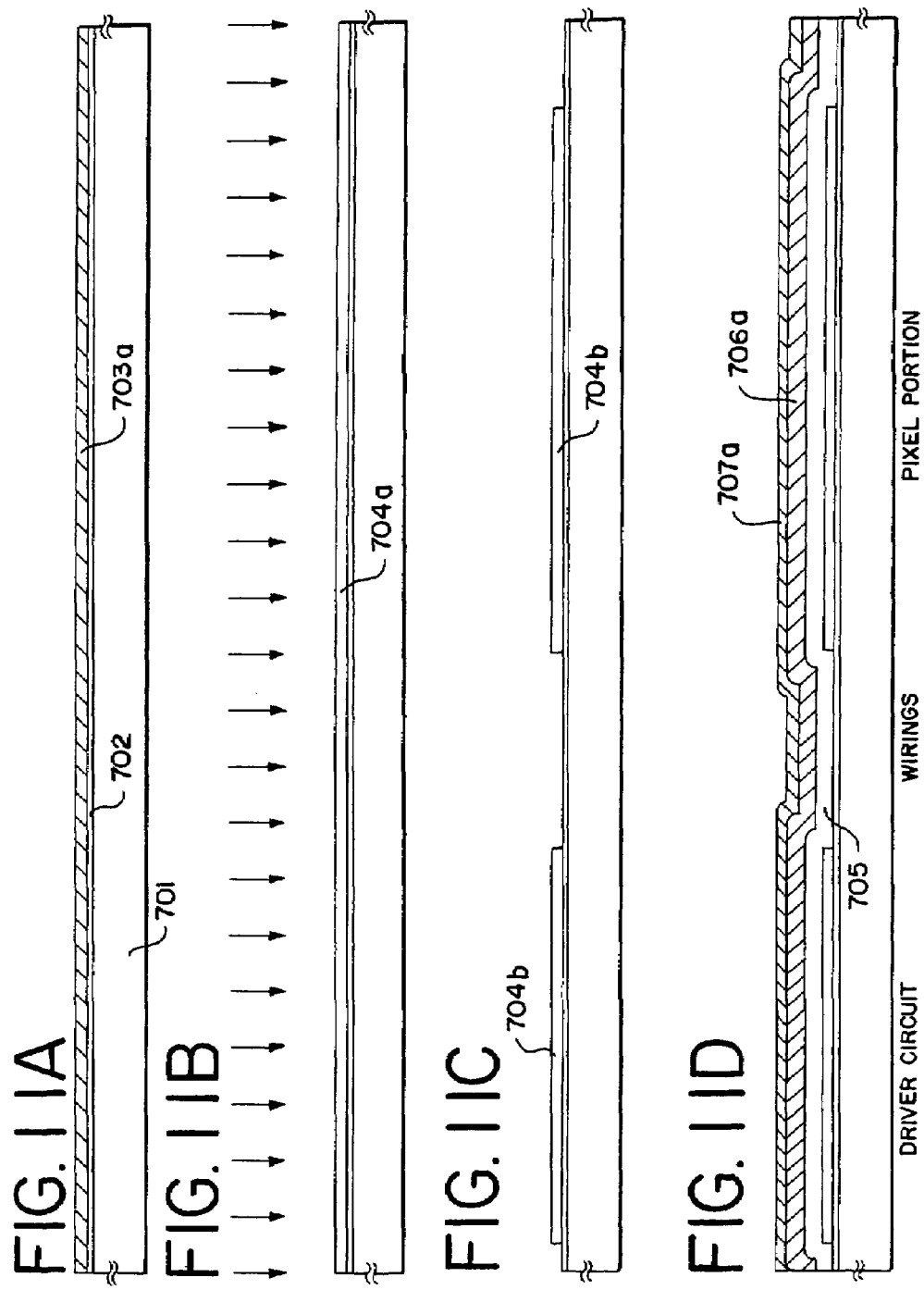

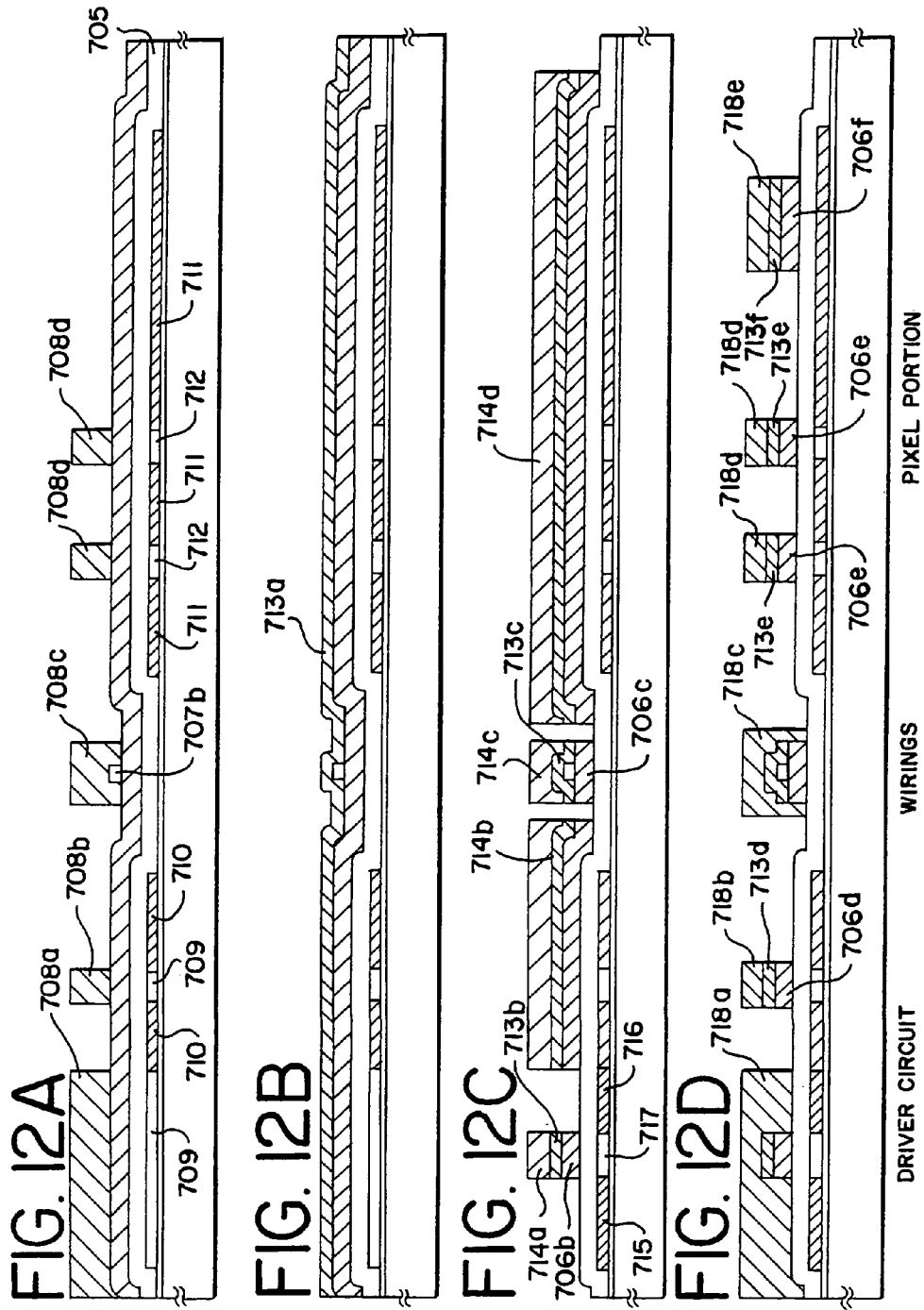

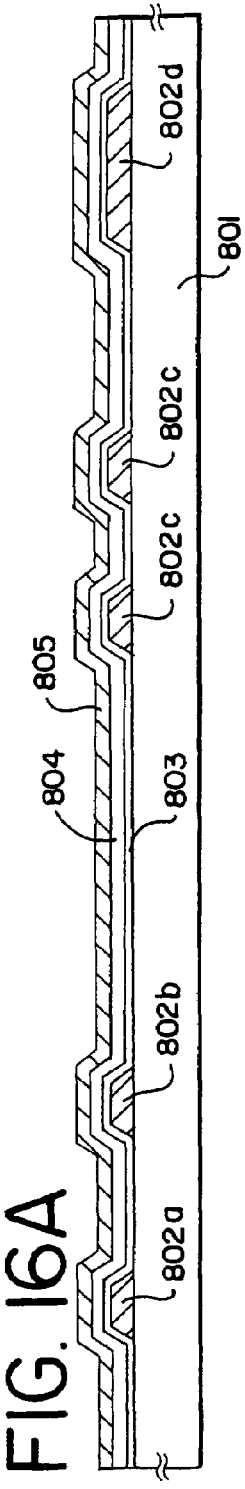
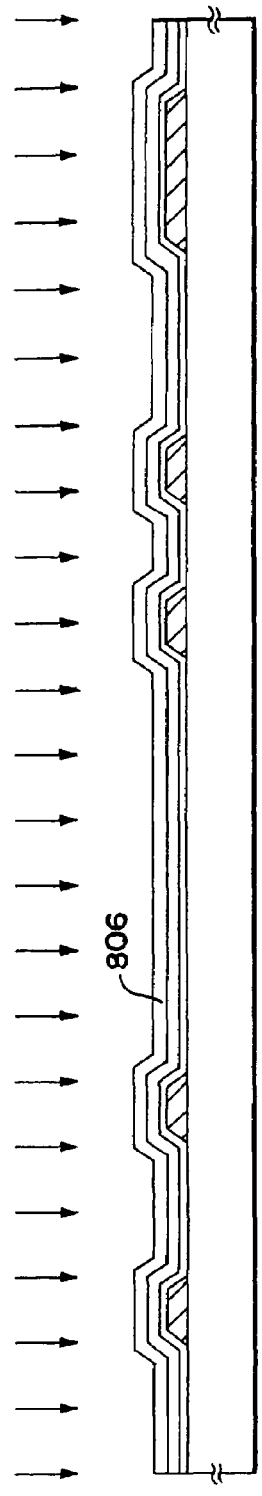
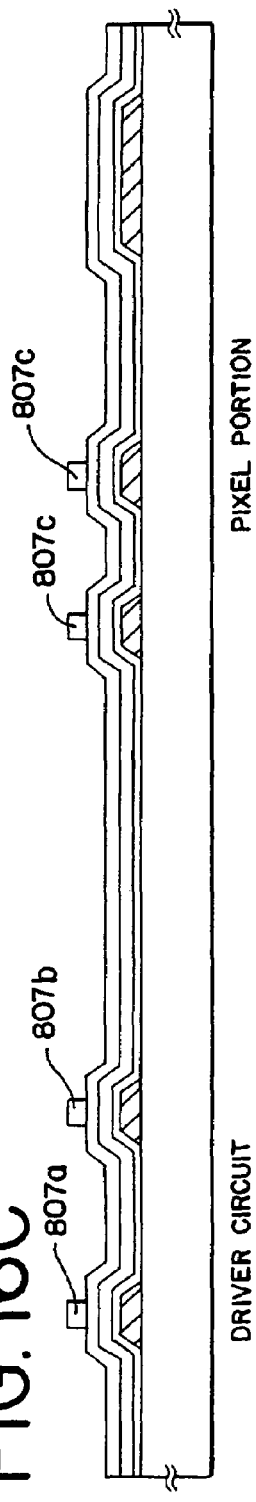

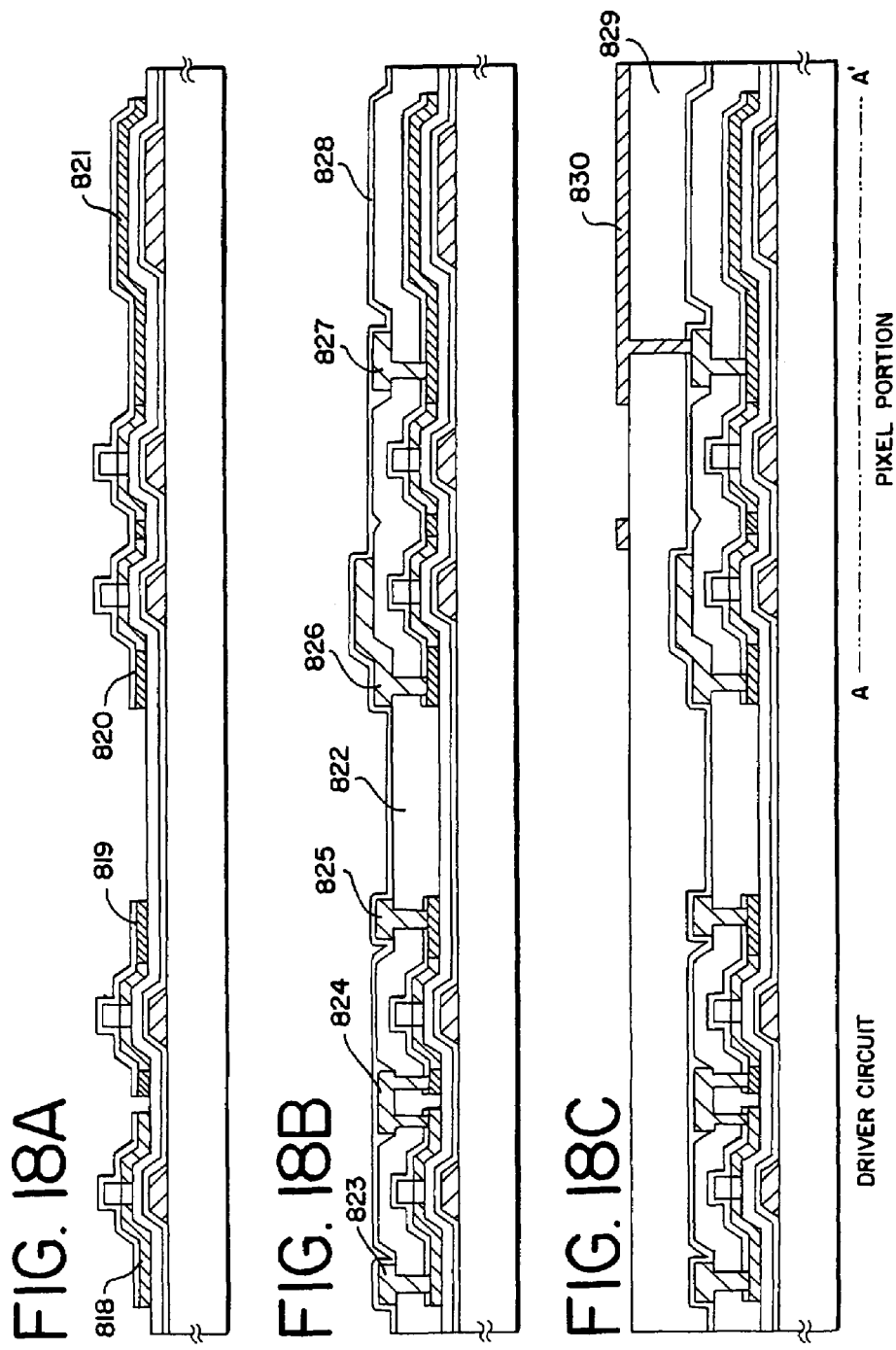

SCANNING DIRECTION

LASER IRRADIATION METHOD, LASER IRRADIATION APPARATUS, AND SEMICONDUCTOR DEVICE

This application is a continuation of U.S. application Ser. No. 11/189,399 filed Jul. 26, 2005 now U.S. Pat. No. 7,095,762 which is a continuation of U.S. application Ser. No. 10/315,779 filed on Dec. 10, 2002 (now U.S. Pat. No. 6,944,195 issued Sep. 13, 2005) which is a continuation of U.S. application Ser. No. 09/500,247 filed on Feb. 8, 2000 (now U.S. Pat. No. 6,535,535 issued Mar. 18, 2003).

BACKGROUND OF THE INVENTION

1. Field of the Invention

The present invention relates to a semiconductor device having a circuit structured with a thin film transistor. For example, it relates to the structure of an electro-optical device, typically a liquid crystal display device, and of an electric equipment loaded with such an is electro-optical device as a component. Note that throughout this specification, the semiconductor device indicates general devices that may function by use of semiconductor characteristics, and that the above stated electro-optical device and electric equipment are categorized as the semiconductor device.

2. Description of the Related Art

In recent years, the technique of crystallizing and improving the crystallinity of an amorphous semiconductor film or a crystalline semiconductor film (a semiconductor film having crystallinity which is polycrystalline or microcrystalline, but is not a single crystal), in other words a non-single crystal semiconductor film, formed on an insulating substrate such as a glass, has been widely researched. Silicon film is often used as the above semiconductor film.

Comparing a glass substrate with a quartz substrate, which is often used conventionally, the glass substrate has the advantages of low cost and good workability, and can be easily formed into a large surface area substrate. This is why the above research is performed. In addition, the reason for preferably using a laser for crystallization is that the melting point of a glass substrate is low. High energy can be imparted to a non-single crystal film be means of a laser without causing much change in the temperature of the substrate.

A crystalline silicon film formed by performing laser annealing has a high mobility. Accordingly, it is actively used in monolithic type liquid crystal electro-optical devices, where thin film transistors (TFTs) are formed using this crystalline silicon film, for example, TFTs for driving pixels and for driver circuits, are formed on one glass substrate. The crystalline silicon film is formed from many crystal grains. Therefore, it is called a polycrystal silicon film or a polycrystal semiconductor film.

Further, a method of performing laser annealing by processing a high output pulse laser beam, such as an excimer laser by means of optical system, into a square spot of several centimeters, or into a linear shape with a length of 10 cm or more, on the surface to be irradiated, and scanning the laser beam (the laser beam irradiation position is moved relatively to the surface to be irradiated), has been preferably used because it has good mass productivity and is superior industrially. In addition, continuous emission lasers with very high output, such as an Ar laser, have been recently developed. There are reports of good results obtained when using a continuous emission laser for annealing a semiconductor film.

In particular, if a linear shape laser beam is used, then a high degree of mass productivity can be obtained because unlike the case of using a spot shape laser beam with which it is necessary to scan forward, back, left, and right, laser irradiation can be performed over the entire surface to be irradiated by scanning only at a right angle to the longitudinal direction of the linear shape laser. This is because scanning at a right angle to the longitudinal direction is the most efficient scanning direction. Due to this high mass productivity, the present use in laser annealing of a linear shape laser beam in which a pulse emission excimer laser beam is processed into a suitable optical system, is becoming a mainstream.

For the case of processing the above pulse emission excimer laser beam into a linear shape and irradiating the linear shape laser beam while scanning, for example, with a non-single crystal silicon film, the phenomenon of stripes at a portion where the beams overlap is noticeable. (Refer to FIG. 22A.)

The semiconductor characteristics of the film differ remarkably for each of these stripes, so if this striped film is used when forming an integrated driver and pixel (system on panel) liquid crystal display device, a drawback develops where these stipes appear on the screen, as is. The stripes which appear on the screen are caused by the non-uniform crystallinity in both the driver section and the pixel portion. This problem is being remedied by improving the film quality of the non-single crystal silicon film, the laser irradiation object, but this is not yet enough.

SUMMARY OF THE INVENTION

An object of the present invention is to solve this problem. The cause of the striped pattern is the energy diffusion in the width direction near the edges of the linear shape laser beam. In general, when a linear shape laser beam is formed, an optical system called a beam homogenizer is used to make the beam homogenous. A beam so processed has a very high homogeneity.

However, with respect to the light quality, there is a region in which the energy is gradually attenuated on the linear shape laser beam edge. The crystallinity of a semiconductor film irradiated with this region is poor relative to a region exposed to the center of the beam. A method is then taken of increasing the crystallinity of the regions in which crystallinity is poor by overlapping irradiation while gradually displacing the linear shape laser beam in the width direction of the beam.

The most suitable overlap pitch has been found by experiment of the inventors of the present invention to be approximately one tenth of the beam breadth (half width). Thus the crystallinity of the above region with poor crystallinity is improved. In the above example, the half line width is 0.6 mm, so laser irradiation is performed with an excimer laser pulse frequency of 30 Hz at a scanning velocity of 1.8 mm/s. The energy density of the laser at this time is 380 mJ/cm$^2$. The methods stated to this point are very general methods of using a linear shape laser to crystallize a semiconductor film.

Continuous light excimer emission laser devices have been developed recently. In order to promote the excitation of an emission gas, microwaves are used in this laser. By irradiating the emission gas with gigahertz order microwaves, the rate determining reaction of the emission is promoted. Thus the development of the continuous emission excimer laser, which has been not available, becomes possible.

The advantage of using an excimer laser for crystallization of a silicon film is the high absorption coefficient of an excimer laser for a silicon film. The absorption coefficient for a silicon film of a continuous emission argon laser having a wavelength of approximately 500 nm, the wavelength often used in crystallization of a silicon film, is on the order of $10^5$/cm. The intensity of an argon laser is attenuated to 1/e (where e is the natural logarithm) at the point where it has transmitted 100 nm of the silicon film. However, an excimer laser has an absorption coefficient on the order of $10^6$/cm, one order of magnitude higher, so its intensity is attenuated to 1/e at the point where it has transmitted 10 nm of the silicon film.

In general, it is suitable for the thickness of a silicon film, which becomes a semiconductor element material, formed on a glass substrate to be approximately 50 nm. If the silicon film is thicker than 50 nm, there is a tendency for the off characteristics to become poor, while a thinner film influences the reliability.

However, when a 50 nm silicon film is irradiated with an argon laser, over half of the argon laser light goes through the silicon film and is irradiated on the glass substrate. The glass substrate, which one does not want to be heated due to its melting point, is thus heated more than necessary. In practice, when attempting crystallization by argon laser of a 200 nm silicon oxide film and a 50 nm silicon film formed in order on a Corning 1737 substrate, the glass changes shape before there is sufficient crystallization.

On the other hand, in the case of irradiation by an excimer laser, almost all of the light energy is absorbed in the 50 nm silicon film. Therefore nearly all of the excimer laser light can be used in crystallizing the silicon film.

Considering the above, use of an excimer laser for crystallization of a silicon film is good. An excimer laser, with a high absorption coefficient in a silicon film, is becoming more and more important for crystallizing a semiconductor film because continuous emission types have become available.

Provided that a continuous emission excimer laser is used, the pulse laser irradiation marks do not form, which is the subject of the present invention. Therefore a film with very high homogeneity can be obtained.

The undulations of a silicon film formed by pulse laser irradiation are shown in FIGS. 22A to 22C, while the undulations of a silicon film formed by continuous emission laser irradiation are shown in FIGS. 1A to 1C.

A diagram, as seen from above, of a silicon film irradiated by scanning a conventional pulse emission excimer laser is shown in FIG. 22A. FIG. 22B is a cross sectional diagram of a cross section cut parallel to the scanning direction of the pulse emission excimer laser (in the vertical face of the silicon film which includes the line segment EF). In addition, FIG. 22C is a cross sectional diagram of a cross section of a vertical face of the silicon film face at a right angle to the above cross section (in the vertical face in the silicon film which includes the line segment GH).

As can be understood from FIG. 22B, undulations of the same order as the silicon film thickness have developed in the pulse laser irradiation marks. On the other hand, the undulations shown in FIG. 22C are occurred due to the energy non-uniformity in the longitudinal direction of the linear shape laser beam, and compared to the undulations of FIG. 22B, are very small.

The diagram shown in FIG. 1A is a view seen from above of a silicon film irradiated while scanning a continuous emission excimer laser. FIG. 1B is a cross sectional diagram of a cross section cut parallel to the scanning direction of the continuous emission excimer laser (in the vertical face of the silicon film which includes the line segment AB). In addition, FIG. 1C is a cross sectional diagram of a cross section of a vertical face of the silicon film face at a right angle to the above cross section (in the vertical face in the silicon film which includes the line segment CD).

As can be understood from at FIG. 1B, the irradiation marks of the continuous emission excimer laser can be nearly disregarded when compared with the irradiation marks of the pulse laser. On the other hand, the undulations shown in FIG. 1C are occurred due to the energy non-uniformity in the longitudinal direction of the linear shape laser beam.

BRIEF DESCRIPTION OF THE DRAWINGS

FIG. 10 is a diagram showing the state of a laser irradiation for the multiple substrate of Embodiment 7;

FIGS. 11A to 11D are diagrams showing the manufacturing process of an AM-LCD of Embodiment 8;

FIGS. 12A to 12D are diagrams showing the manufacturing process of an AM-LCD of Embodiment 8;

FIGS. 16A to 16C are diagrams showing the manufacturing process of an AM-LCD of Embodiment 9;

FIGS. 18A to 18C are diagrams showing the manufacturing process of an AM-LCD of Embodiment 9;

DETAILED DESCRIPTION OF THE PREFERRED EMBODIMENTS

Embodiment Mode

Figure 1A:
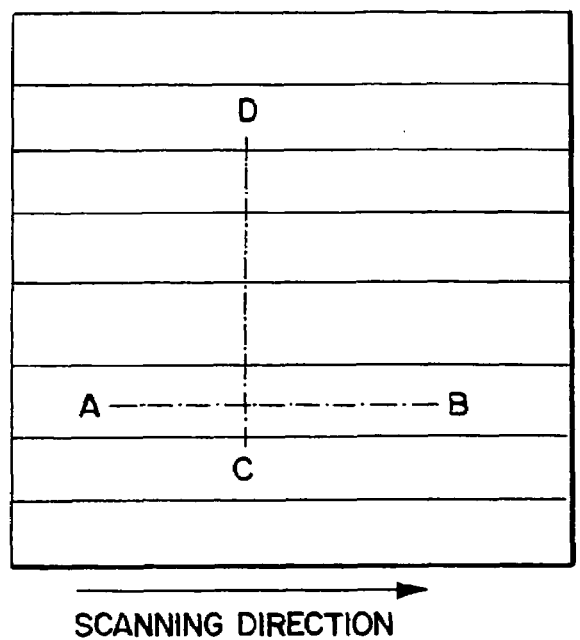
FIGS. 1A to 1C are diagrams showing a surface of a silicon film laser crystallized by a linear shape laser of the present invention.
Figure 1B:
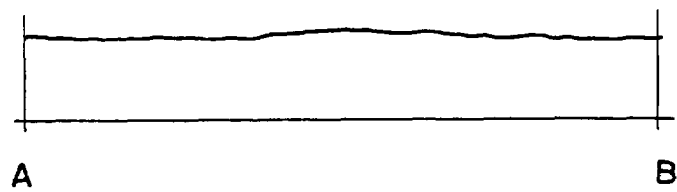
Figure 1C:
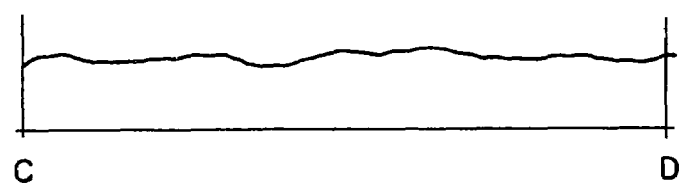

A specific method of crystallizing an amorphous silicon film using a continuous emission excimer laser is described here.

First, a 125×125×0.7 mm glass substrate (Corning 1737) is prepared as a substrate. This substrate has sufficient durability up to a temperature of 600□. A 200 nm silicon oxide film is deposited on the glass substrate as a base film. In addition, a 55 nm thick amorphous silicon film is deposited on top. Plasma CVD is used for both film depositions. In addition, film deposition may be performed by a known deposition method such as sputtering.

The substrate, on which the above films have been deposited, is then exposed to a hot bath at 450□ for 1 hour. This process is one for reducing the concentration of hydrogen in the amorphous silicon film. If there is too much hydrogen in the film, the film cannot completely withstand the laser energy, so this step is added. A hydrogen density on the order of $10^{20}$ atoms/cm$^3$ in the film is suitable.

A 1000 W KrF excimer laser is used as a continuous emission excimer laser in this embodiment. The emission wavelength is 248 nm.

If the energy fluctuations of the excimer laser are held to within ±10%, preferably within ±3%, and more preferably within ±1%, during the laser processing of one substrate, then homogeneous crystallization can be performed.

Laser energy fluctuation as stated throughout this specification is defined below. Namely, the average value of laser energy during the period of irradiation of one substrate is taken as a standard, and for the laser energy fluctuation, the difference between the average value and the lowest energy or the highest energy during the period is expressed by percentage.

In order to crystallize a silicon film without heating a glass substrate at an output of 1000 W, it is necessary to reduce the spot size of the laser beam on the irradiation surface, and to increase the energy density.

As written through this specification, "spot size" indicates the laser beam size on all irradiation surfaces. The spot size at this time is defined as the surface area of the region with an energy density greater than half of the largest laser energy density value.

The inventors of the present invention has calculated a heat balance at the laser irradiation, and the largest spot size which can crystallize the amorphous silicon film without imparting any thermal damage to the glass is estimated to be 0.5 mm$^2$. The thermal conductivity of the base silicon oxide film was taken as 0.02 W/cm·K for this calculation. In addition, the thermal conductivity of the amorphous silicon film was taken as 0.2 W/cm·K. These thermal conductivities depend upon temperature, but can be considered to be nearly constant from 300 K to the melting point of the amorphous silicon film (this can be considered on the order of 1200 to 1600 K). The details of this calculation are shown in embodiment 1.

The spot size calculated above is very small when compared to that of a conventional pulse emission excimer laser. Therefore, using a continuous emission excimer laser to form a linear shape laser beam with the same size as the conventional, it is necessary to wait for the development of a laser with an additionally higher output.

In order to utilize a continuous emission excimer laser, possessing the largest spot size calculated above, in the manufacture of a liquid crystal display device, for example, it may be used in the crystallization of only the driver section of the low temperature TFT liquid crystal display device of an integrated driver and pixel. In general, there is a demand for good characteristics of a driver TFT of a liquid crystal display device, when compared to a pixel TFT. By using laser irradiation in only the driver section, the characteristics of the driver can be made to improve by leaps and bounds. On the other hand, the pixel portion is satisfactory with the amorphous silicon as is.

The above laser is transformed into a 5 mm (corresponding to the width of the driver)×0.1 mm size by use of a suitable optical system. A combination of a cylindrical lens array and a condensing cylindrical lense is used in the optical system. Synthetically fused quartz, which is transparent to ultraviolet light, is used as the lens material constituting the optical system. An AR coating process is performed so that a 248 nm wavelength transmission ratio of over 99% can be obtained in the lense surface. This is in order to increase the transmission ratio and the laser resistance.

Figure 3:
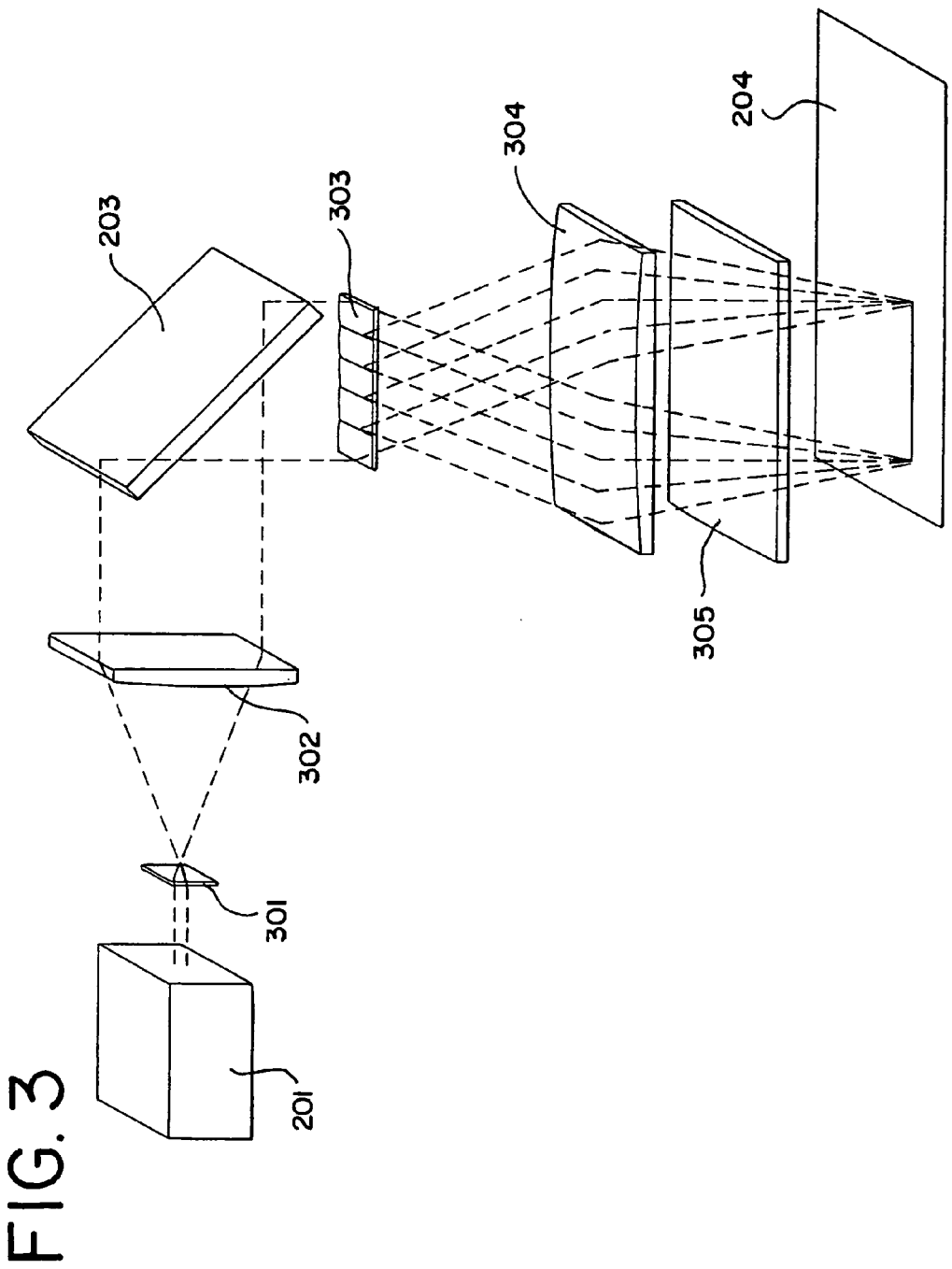
FIG. 3 is an optical system which forms a linear shape laser beam of the present invention.

The structure of the optical system may be, for example, that shown in FIG. 3. It has been calculated that the beam size of a 1000 W continuous emission excimer laser which may have stable emission is a circular beam with a diameter on the order of 0.3 mm. Therefore, the beam is first expanded in one direction by using a beam expander structured by cylindrical lenses 301 and 302. The beam is next split by a cylindrical lens array 303, and is additionally formed into a 5 mm long beam on the irradiation surface by a condensing cylindrical lens array 304.

A cylindrical lens 305 is placed at a right angle to the above cylindrical lens, and the roughly 0.3 mm width beam is made into a 0.1 mm width beam on the irradiation surface.

Note that the focal length and thickness of each of the lenses is as listed below. The cylindrical lens 301 has a focal length of 10 mm and a thickness of 2 mm; the cylindrical lens 302 has a focal length of 170 mm and a thickness of 5 mm; the cylindrical lens array 303 each has focal lengths of 20 mm and thicknesses of 3 mm; the cylindrical lens 304 has a focal length of 100 nm and a thickness of 3 mm; and the cylindrical lens 305 has a focal length of 20 mm and a thickness of 3 mm.

A mirror 203 is placed directly after the beam expander. This mirror is not necessarily needed. The mirror is coated so that the reflectance is maximized at an angle of incidence of 45 degrees.

The gap between the cylindrical lenses 301 and 302, which structure the beam expander, is approximately 180 mm. The gap may be regulated if necessary so that the beam enters the full width of the cylindrical lens array 303. The gap between the cylindrical lens array 303 and the cylindrical lens 304 is set at 120 mm.

The surface of the object to be irradiated is set 100 mm behind the cylindrical lens 304. In addition, the cylindrical lens 305 is placed in a position 14 mm from the surface of the object to be irradiated. The above values can be changed in order to perform fine tuning, if necessary, after actually setting the laser. The optical system placements may be in accordance with those given by geometrical optics.

If the above beam shape on the irradiation surface is a linear shape continuous emission excimer laser, and the energy distribution in the longitudinal direction is within ±5%, then homogeneous crystallization of the silicon film can be performed. With the energy distribution preferably within ±3%, more preferably within ±1%, more homogeneous crystallization can be performed.

Figure 2:
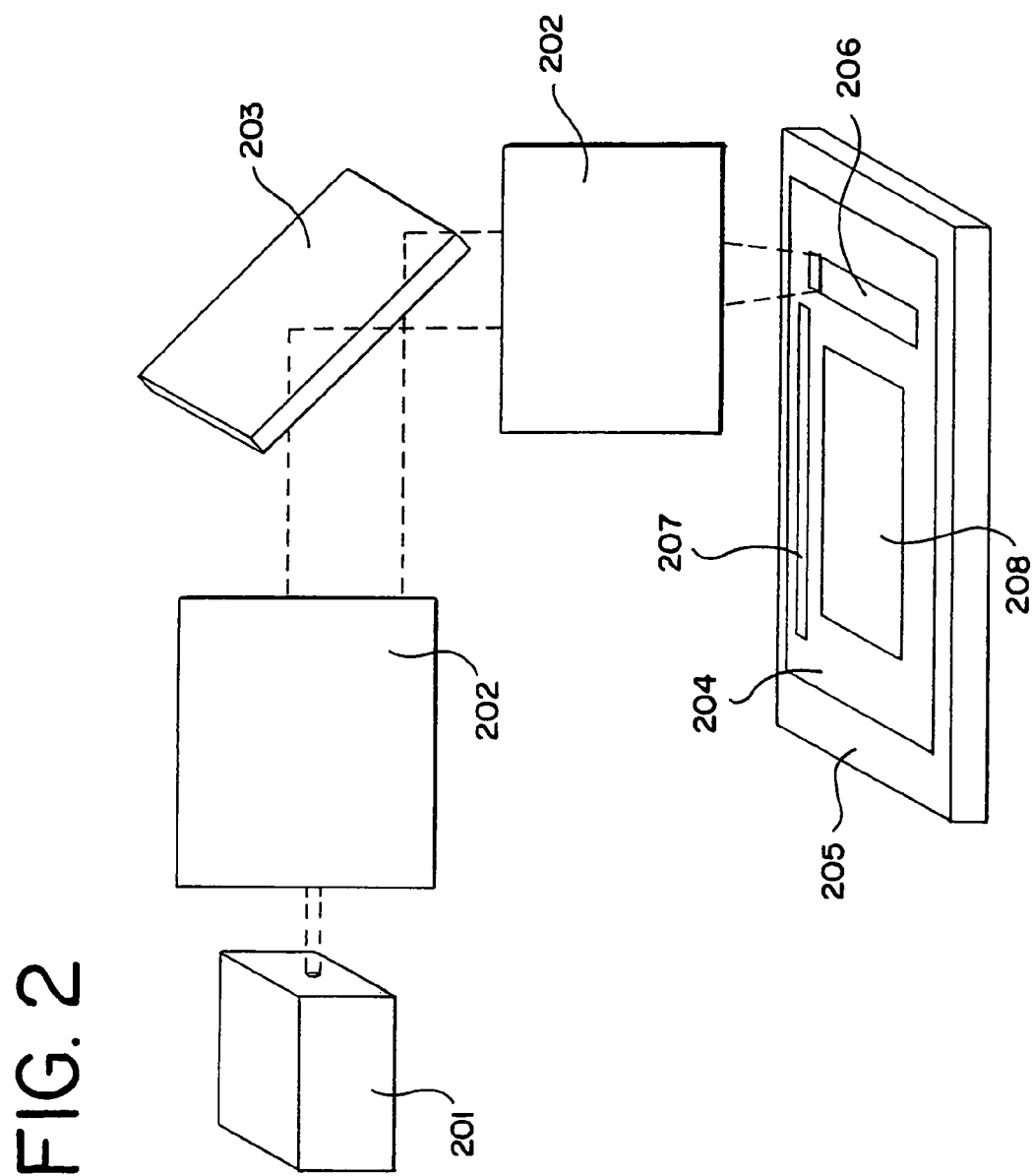
FIG. 2 is a diagram showing a laser irradiation apparatus in a preferred embodiment of the present invention.

An external view of a laser irradiation apparatus is shown in FIG. 2. An continuous emission excimer laser beam is output from a laser emission device 201, is processed into a linear shape by an optical system 202, and is irradiated to a substrate to be processed 204.

The laser irradiation is performed on an XY stage 205. The above substrate is set on the XY stage, and the laser irradiation apparatus is set so that the laser is irradiated at one point of the XY stage 205. The laser focus is regulated to match the substrate surface. The XY stage 205 used has a positioning accuracy of 10 μm.

For example, the gap between a pixel and a driver of an integrated driver and pixel type 3.5 inch liquid crystal display device is on the order of 300 μm. Therefore in order to only irradiate the driver without irradiating the pixel, the accuracy of the above XY stage is sufficient.

Figure 4:
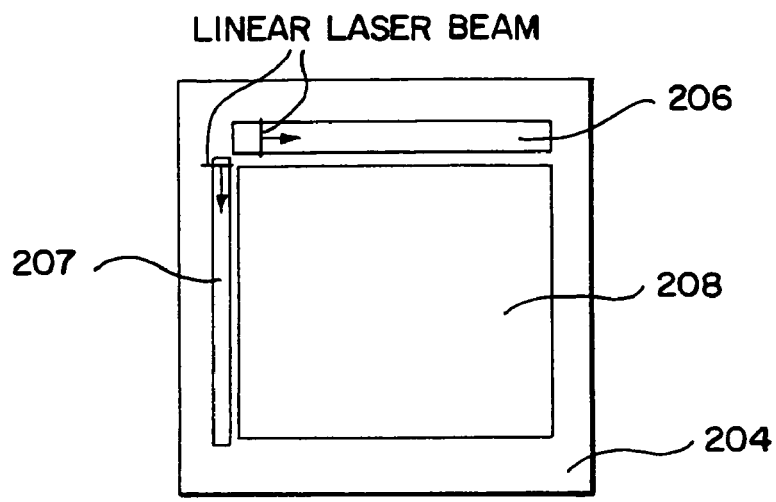
FIG. 4 is a diagram showing the state of a laser irradiation for a driver region of the present invention.

The laser irradiation is, for example, performed while scanning the XY stage as shown in FIG. 4. The laser is made not to hit a pixel region 208 at this time. The scanning speed may be suitably determined by the operator, but a rough standard is to choose the speed in the range of from 0.1 to 10 m/s. It is necessary to pre-run the XY stage before irradiation until the scanning speed reaches the predetermined speed. This process is performed for a source driver region 206 and a gate driver region 207.

Thus the laser annealing process is completed. By repeating the above process, multiple substrates can be processed.

Embodiment 1

The calculation method of the relationship between the laser power and the maximum spot size, estimated in the above embodiment mode of the present invention, is shown here.

The amorphous silicon film formed on the above substrate is taken as a model. The thermal conductivities of the silicon oxide film and the amorphous silicon film are taken as 0.02 W/cm·K and 0.2 W/cm·K, respectively, from room temperature to 1200□ (the temperature assumed to be the melting point of the amorphous silicon film used throughout this specification). The thermal conductivity in the range beyond the melting point temperature of the amorphous silicon film is taken as 2 W/cm·K.

The temperature limitations of each of the films during laser crystallization of the amorphous silicon film are as below.

The glass substrate can be heated up to a maximum of 600□ without any change in shape (the distortion temperature of Corning 1737 is above 600□). On the other hand, if it is assumed that the temperature of the amorphous silicon film must exceed the film melting point entirely, then it must reach 1200□.

It is taken that at a given instant during laser crystallization, the temperature of the amorphous silicon film is 1200□, and the interface temperature between the glass substrate and the silicon oxide film is 600□. (The thermal conductivity of the amorphous silicon film is 1 to 2 orders of magnitude larger than that of the silicon oxide film, so it is assumed that the temperature of the amorphous silicon film becomes equal immediately.) In order to maintain this temperature distribution, it is necessary to supply to the amorphous silicon film an amount of heat that exceeds the amount of heat escaped from the amorphous silicon film due to heat conductivity caused by the temperature gradient that develops in the silicon oxide film.

The heat flow F (W/cm²) flowing in the silicon oxide film when this temperature distribution is imparted is:

$$F = 0.02[W/cm \cdot K] \times (1200 - 600)[K]/2000 \times 10^{-8}[cm]$$
$$= 6 \times 10^5 [W/cm^2].$$

On the other hand, the output of the excimer laser used in this specification is 1000 W, so assuming that the laser spot size which can crystallize the amorphous silicon film is S [cm²], and that the amount of heat supplied by the laser exceeds the amount of heat which is escaped from the silicon oxide film, then:

$$S < 1000[W]/F[W/cm^2]$$
$$< 0.002[cm^2].$$

This is less than half of the maximum spot size shown by the embodiment mode of the present invention. In addition, the merits of using a continuous emission excimer laser with this size are few. Further, the above result ignores the reflection of light from the surface of the amorphous silicon film.

The thickness of the Corning 1737 substrate used is 0.7 mm, so that the calculation was redone with only the extreme surface of the substrate permitted to exceed the distortion point temperature. If the extreme surface of the substrate, only to a depth of 0.001 mm (1/700 of the substrate thickness), is assumed to exceed the distortion point temperature of the substrate, then the interface temperature between the glass substrate and the silicon oxide film can be increased to 1100□.

The heat flow F' (W/cm²) flowing in the silicon oxide film when this temperature distribution is imparted is:

$$F' = 0.02[W/cm \cdot K] \times (1200 - 1100)[K]/2000 \times 10^{-8}[cm]$$
$$= 1 \times 10^5 [W/cm^2].$$

On the other hand, the output of the excimer laser used in this specification is 1000 W, so assuming that the laser spot size which can crystallize the amorphous silicon film is S' [cm²], then:

$$S' < 1000[W]/F'[W/cm^2]$$
$$< 0.01[cm^2].$$

Approximately one-half of the energy is reflected from the amorphous silicon film in the excimer laser wavelength region, resulting in:

(Required laser spot size)<0.01 [cm²]/2<0.005 [cm²].

This is the value used in the embodiment mode of the present invention.

Converting the above results for the continuous emission laser power Lw (W), necessary to crystallize the amorphous silicon film, and for the spot size Sp (cm²) into a relational equation, then:

$$Lw/2Sp > F',$$

therefore, $$Lw > 2 \times 10^5 Sp.$$

All calculations up to now have been performed while assuming that the base film is a 200 nm thick silicon oxide film, that the semiconductor film is a 50 nm thick amorphous silicon film, and that the substrate is a 0.7 mm thick Corning 1737 substrate. Therefore, the above stated results will change if other materials are used or if the thicknesses are changed, however the order of the results will not change.

For example, making the thickness of the base silicon oxide film 400 nm with the above stated conditions, the results become:

$$Lw > 1 \times 10^5 Sp. \quad\quad (Eq.\ A)$$

The minimum spot size required to crystalize the semiconductor film is now considered. When crystallizing the semiconductor film with a spot size smaller than a certain size, the amount of heat that flows away from the outside of the spot (around the circumference of where the spot hits the semiconductor film) due to heat conduction, becomes relatively large compared to the total amount of heat, so the crystallization homogeneity is harmed.

If the above minimum spot size is estimated a little on the large side, and if it is sufficient that the size of one side of the angular beam be on the order of 1000 times the film thickness, then:

$$Sp > (50\ [nm] \times 1000)^2$$

$$Sp > 2.5 \times 10^{-5}\ [cm^2] \quad\quad (Eq.\ B)$$

Figure 5:
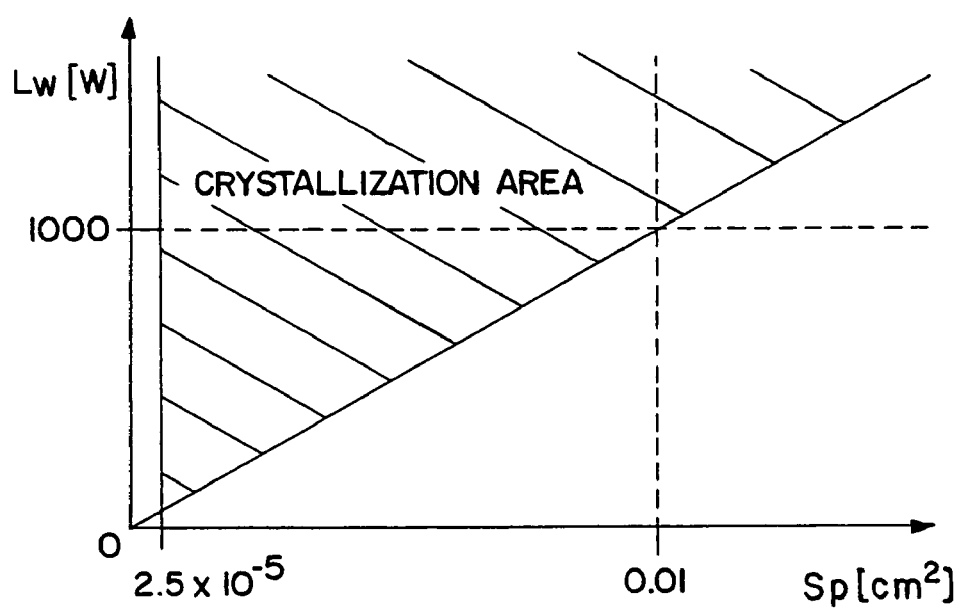
FIG. 5 is a diagram showing the relationship between the continuous emission laser output which can crystallize a non-single crystal silicon film formed on a glass substrate and the spot size of Embodiment 1.

A graph of the relationship between Eq. A and Eq. B is shown in FIG. 5.

Embodiment 2

The spot size calculated in embodiment 1 above is very small, so it is difficult to use for mass production. An example of increasing the laser beam size by a great jump through use of a high distortion point temperature quartz substrate as a substrate is shown, then, in embodiment 2. A quartz substrate does not change in shape, or in quality, at all when heated to the melting point of a silicon film. Therefore, the beam size can be made wider. The irradiation object in embodiment 2 is the substrate having a silicon film formed thereover shown in the embodiment mode of the present invention, where the glass substrate is replaced with a 1.1 mm thick quartz substrate.

An example using a 1000 W continuous emission excimer laser processed into a linear beam shape (with a size of 125 mm×0.4 mm) is shown in embodiment 2. The means of processing the laser into a linear beam shape is shown in FIG. 8.

Figure 8:
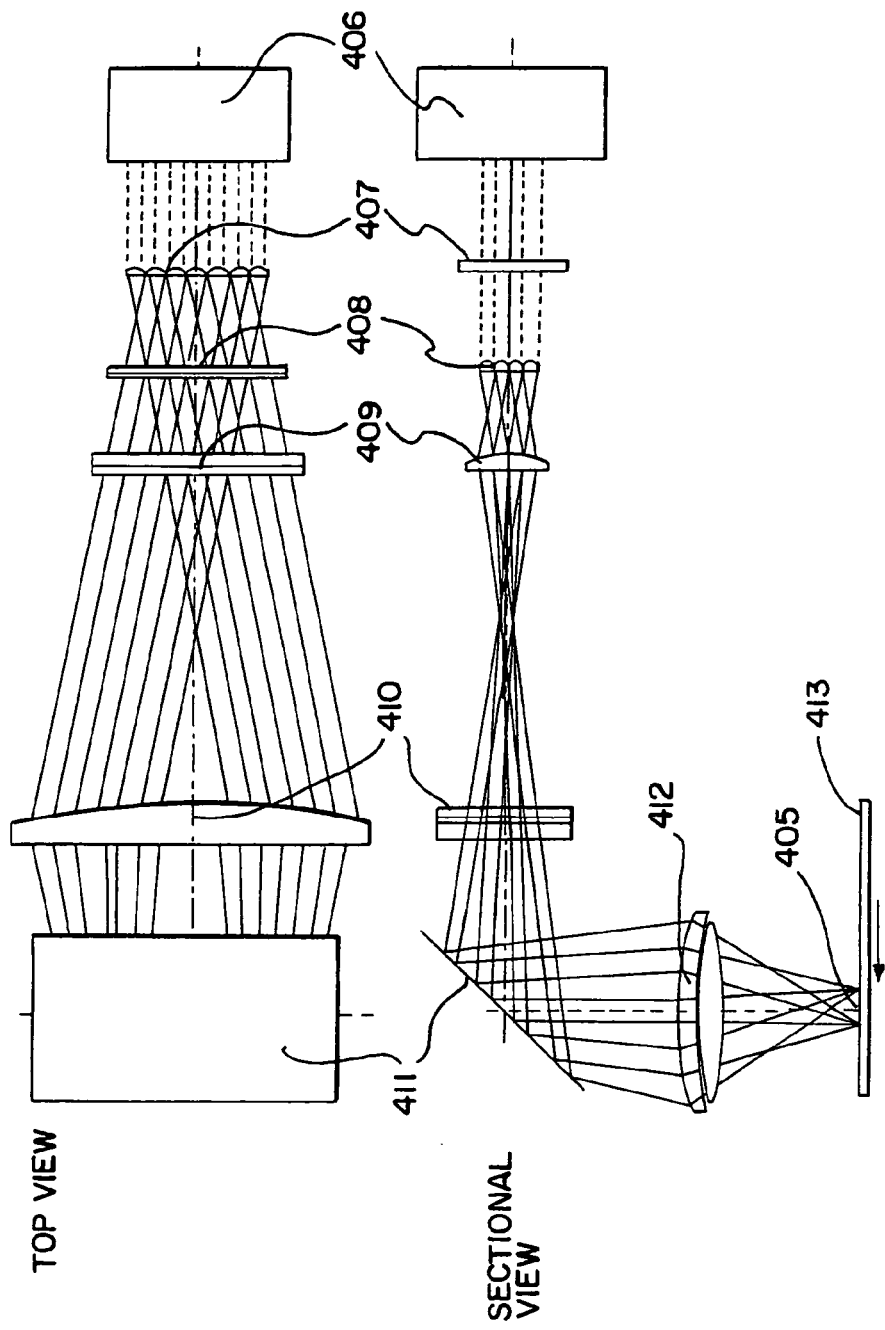
FIG. 8 is a diagram showing an optical system for processing a laser beam into a linear shape of Embodiment 2.

The device shown in FIG. 8 possesses a function of irradiating as a linear shape beam 405 laser light (in this state it has a roughly rectangular shape) from a laser emission device 406, through an optical system shown by reference numerals 407, 408, 409, 410, and 412. A stage 413 is a one axis stage which moves in one direction. A substrate placed on the stage 413 is irradiated by scanning.

Note that the size of the laser beam emitted from the laser emission device is originally a 0.3 mm circular beam in diameter, but this is expanded into a roughly 10×35 mm ellipse by using a two sets of beam expanders (not shown). Reference numeral 411 denotes a mirror.

The above optical system is entirely manufactured from quartz. Quartz is used because it has a sufficiently high transmissivity for the wavelength range of an excimer laser. In addition, coating of the optical system surface is performed with a coating appropriate for the wavelength of the excimer laser used (248 nm in this specification). Thus a transmissivity of at least 99% can be obtained by a single lense. Further, the durability of the lense is increased.

Reference numeral 407 denotes a cylindrical lens array, possessing a function of splitting a beam into multiple beams. This multiple number of split beams is synthesized into a single beam by a cylindrical lens 410.

This structure is necessary in order to make the intensity distribution uniform within the beam. In addition, the combination of the cylindrical lens array 408 and the cylindrical lens 409 possesses the same function as the combination of the cylindrical lens array 407 and the cylindrical lens 410.

The combination of the cylindrical lens array 407 with the cylindrical lens 410 possesses a function of making the intensity distribution uniform in the longitudinal direction of the linear shape laser beam. The combination of the cylindrical lens array 408 with the cylindrical lens 409 possesses a function of making the intensity distribution uniform in the width direction of the linear shape laser beam.

A beam with a beam width w is first formed by the combination of the cylindrical lens array 408 with the cylindrical lens 409. By passing through the mirror 411, and in addition by placing a doublet cylindrical lens 412, a more fine linear shape laser beam (finer than the beam width w) can be obtained.

The energy distribution of the linear shape laser beam formed by the optical system of FIG. 8 shows a rectangular shape distribution when looking at a cross section in the width direction. In other words, a linear shape laser beam with extremely high homogeneity with regard to energy density can be obtained.

Seven cylindrical lenses with a focal length of 41 mm, a width of 5 mm, a length of 30 mm, and a center thickness of 5 mm are used as the cylindrical lense array 407.

In addition, five cylindrical lenses with a focal length of 250 mm, a width of 2 mm, a length of 60 mm, and a center thickness of 5 mm are used as the cylindrical lense array 408.

In addition, a cylindrical lense with a focal length of 200 mm, a width of 30 mm, a length of 120 mm, and a center thickness of 10 mm is used as the cylindrical lense 409.

In addition, a cylindrical lense with a focal length of 1022 mm, a width of 180 mm, a length of 40 mm, and a center thickness of 35 mm is used as the cylindrical lense 410.

In addition, cylindrical lenses with a width of 90 mm, a length of 160 mm, and a center thickness of 16 mm are combined into a set with a synthetic focal length of 220 mm and used as the doublet cylindrical lens 412.

Note that all of the above lenses have curvature in the width direction, and all are spherical lenses. The lens material is synthetic quartz, and an AR coating process is performed so that a transmissivity of at least 99% can be obtained at a transmitted light wavelength of 248 nm.

In addition, the cylindrical lens array 407 is placed toward the laser, 2100 mm from the irradiation surface, along the laser light path.

In addition, the cylindrical lens array 408 is placed toward the laser, 1980 mm from the irradiation surface, along the laser light path.

In addition, the cylindrical lens 409 is placed toward the laser, 1580 mm from the irradiation surface, along the laser light path.

In addition, the cylindrical lens 410 is placed toward the laser, 1020 mm from the irradiation surface, along the laser light path.

In addition, the doublet cylindrical lense 412 is placed toward the laser, 275 mm from the irradiation surface, along the laser light path.

The values stated above are rough standards, and depend upon the manufacturing precision of the lenses.

Figure 7:
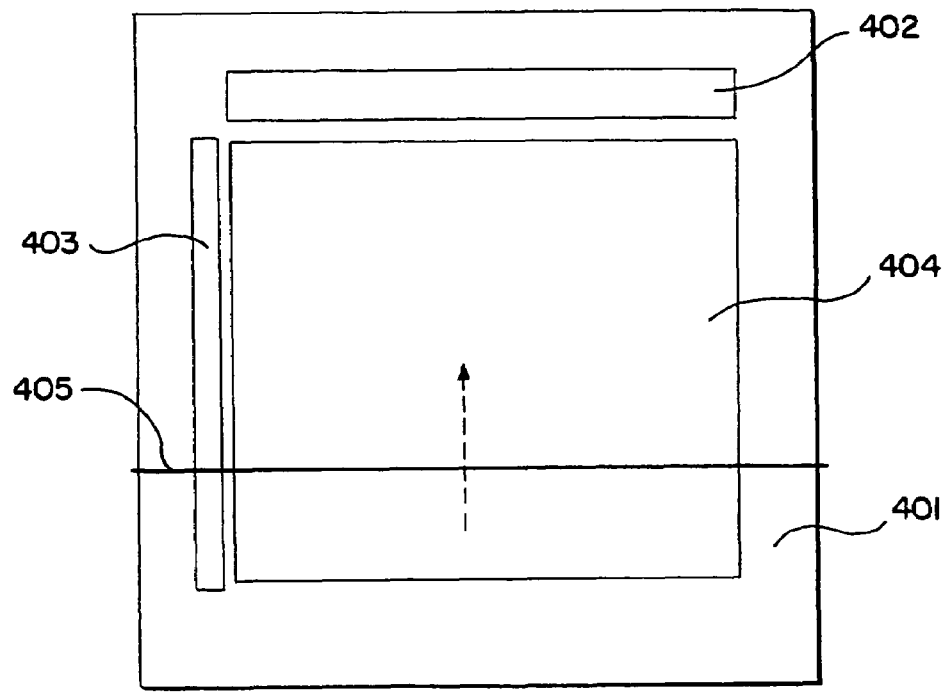
FIG. 7 is a diagram showing the state of a linear shape laser beam irradiation for an entire substrate surface of Embodiment 2.

By scanning the linear shape continuous emission excimer laser beam processed into the above stated size using the method shown in FIG. 7, the entire silicon film surface is crystallized. Since the length of the long side of the linear shape laser beam is greater than the length of the short side of the silicon film, the entire substrate surface can be crystallized by one scan. In FIG. 7 reference numeral 401 denotes a substrate, 402 denotes a source driver region, 403 denotes a gate driver region, 404 denotes a pixel region and 405 denotes a linear shape beam laser light. As can be understood by looking at FIG. 7, the entire silicon film is crystallized by one scan of the linear shape laser beam.

The scanning speed may be suitably chosen by the operator, but as a rough guideline it is suitably selected in the range of from 0.5 to 100 mm/s. At this time it is necessary to pre-run the XY stage before irradiation until the scanning speed reaches the predetermined speed.

Embodiment 3

Embodiment 3 shows a process of crystallizing a silicon film formed on a glass substrate using a 1000 W continuous emission excimer laser with the same specifications as that of embodiment 2. An example is shown in which the extreme surface of the glass substrate melts by the crystallization process of embodiment 3, so a base film is made rather thick in order to prevent contamination of the silicon film.

First, a 125×125×0.7 mm glass substrate (Corning 1737) is prepared as a substrate. This substrate has sufficient durability up to a temperature of 600□. A 400 nm silicon oxide film is deposited on the glass substrate as a base film. In addition, a 55 nm thick amorphous silicon film is deposited on top. Sputtering is used for both film depositions. Alternately, film deposition may also be performed by plasma CVD.

The substrate, on which the above films have been deposited, is then exposed to a hot bath at 450□ for 1 hour. This process is one for reducing the concentration of hydrogen in the amorphous silicon film. If there is too much hydrogen in the film, the film cannot completely withstand the laser energy, so this step is added. A hydrogen density on the order of $10^{20}$ atoms/cm³ in the film is suitable.

The thickness of the Corning 1737 substrate used is 0.7 mm, so a calculation was performed with only the surface of the substrate permitted to exceed the distortion point temperature. If the surface of the substrate, to a depth of only 0.1 mm (1/7 of the substrate thickness), is assumed to exceed the distortion point temperature, then the interface temperature between the glass substrate and the silicon oxide film can be increased to 1198□.

The heat flow F″ (W/cm²) flowing in the silicon oxide film when this temperature distribution is imparted is:

$$F'' = 0.02[W/cm \cdot K] \times (1200 - 1198)[K]/4000 \times 10^{-8}[cm]$$

$$= 1 \times 10^3 [W/cm^2].$$

On the other hand, the output of the excimer laser used in this specification is 1000 W, so assuming that the laser spot size which can crystallize the amorphous silicon film is S″ [cm²], then:

$$S'' < 1000[W]/F''[W/cm^2]$$

$$< 1[cm^2].$$

Approximately one-half of the energy is reflected from the amorphous silicon film in the excimer laser wavelength region, resulting in:

$$(\text{Required laser spot size}) < 1[cm^2]/2$$

$$< 0.5[cm^2].$$

The spot size of the laser beam used in embodiment 3 is:

0.4×125 mm=0.5 [cm²], corresponding to the maximum value of the above results.

Converting the above results for the continuous emission laser power Lw (W), necessary to crystallize the amorphous silicon film, and for the spot size Sp (cm²) into a relational equation, then:

$Lw/2Sp > F''$, therefore, $Lw > 2 \times 10^3 Sp$.

All calculations up to now have been performed while assuming that the base film is a 400 nm thick silicon oxide film, that the semiconductor film is a 55 nm thick amorphous silicon film, and that the substrate is a 0.7 mm thick Corning 1737 substrate. Therefore, the above stated results will change if other materials are used or if the thicknesses are changed; however the order of the results will not change.

Embodiment 4

A method of irradiating a polycrystal silicon film with a continuous emission excimer laser is shown in embodiment 4.

Corning 1737 is used as a glass substrate. A 200 nm thick silicon oxide film and a 50 nm thick amorphous silicon film are deposited in order on one face of the substrate. Afterward, this is exposed to a nitrogen atmosphere at 600□ for 24 hours, crystallizing the amorphous silicon film.

In addition, the technique described in embodiment 2 of Japanese Patent Application Laid-open No. Hei 7-130652 (corresponding to U.S. patent Ser. No. 08/329,644) may be used for crystallization of the amorphous silicon film. The technique described in the above publication is a technique for performing crystallization by which a catalytic element for promoting crystallization (cobalt, palladium, germanium, platinum, iron, copper, typically nickel) is selectively maintained in the surface of the amorphous silicon film, with that section used as a seed for growth.

First, an aqueous nickel acetate solution with a concentration of 10 ppm may be applied on the amorphous silicon film, and this may be exposed to a nitrogen atmosphere at 550□ for 4 hours, performing crystallization of the amorphous silicon film. Spin coating may be used as the application method.

The amorphous silicon film added with nickel by this technique is crystallized at a low temperature over a short time. It is thought that the cause of this is that the nickel fulfills the role of a crystal growth nucleus, promoting the crystal growth.

There are many defects included in the amorphous silicon film crystallized by the above method due to the low crystallization temperature, and there are cases in which it is insufficient for use as a semiconductor element material. Thus, in order to increase the crystallization of the polycrystalline silicon film, the film is irradiated with a laser.

The laser used is the one employed in the embodiment mode of the present invention. Further, the laser irradiation method may also be the same as that of the embodiment mode of the present invention. The relationship shown in embodiment 1 between the laser output and the spot size required to crystallize the amorphous silicon film is the same for a polycrystalline silicon film.

The reason is that number of defects exist within the polycrystal silicon film. The defect regions possess the same physical properties as those of amorphous silicon, so the laser irradiation method shown in the embodiment mode of the present invention can be used to restore the regions with defects.

Embodiment 5

A crystallization method of the entire surface of a substrate by laser is shown in embodiment 5. In the embodiment mode of the present invention, crystallization of only the driver region was performed, but the entire substrate surface is irradiated with laser in embodiment 5.

The laser used is the one shown in FIG. 2. The beam length is 5 mm, so the entire substrate surface is laser irradiated while shifting the scanning position by 5 mm at a time. Controlling the overlapping sections between one laser scanning region and the neighboring scanning region is very important.

The characteristics are rather poor in the sections in which the laser overlaps, as explained before. Therefore, the overlapping regions are set so as not to go into element regions. The overlapping sections are exposed to attenuated energy regions at the tips of the laser beam in the longitudinal direction. Although it depends upon the precision of the optical system forming the laser beam, with the present technological standards, the attenuated regions can be suppressed on the order of 50 µm.

Therefore, the 5 mm long laser beam used in embodiment 5 is irradiated over the entire substrate surface with an overlap of 50 µm. The location of element channel forming regions, offset regions, and LDD regions are set so as not to be in the overlapped regions.

Figure 6:
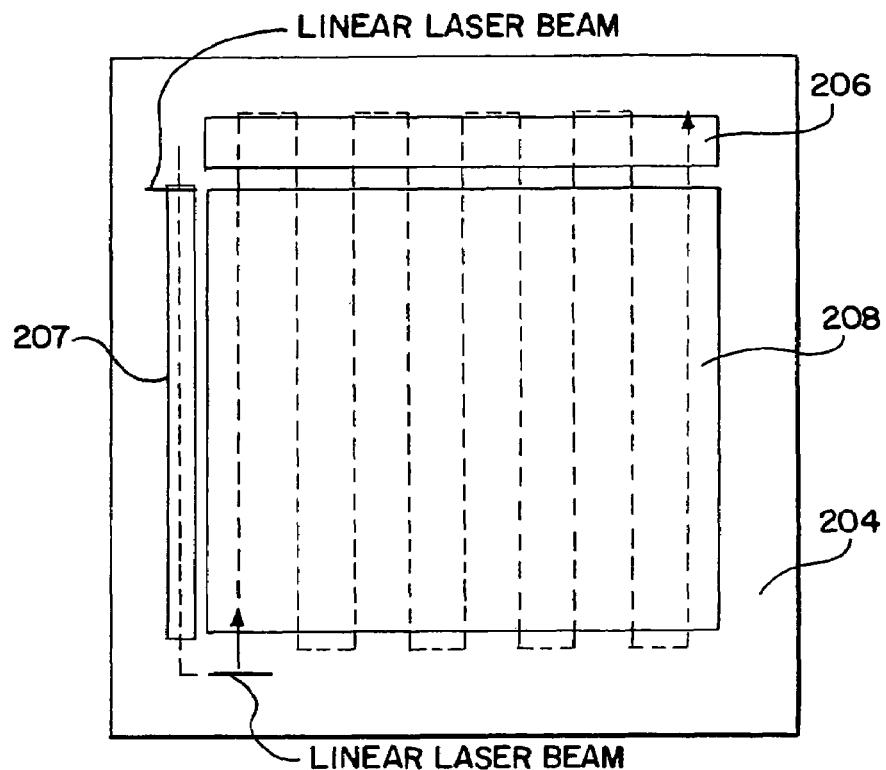
FIG. 6 is a diagram showing the state of a laser irradiation for an entire substrate surface of Embodiment 5.

The entire surface irradiation state is shown in FIG. 6.

Embodiment 6

When liquid crystal panels are mass produced, generally a method is performed in which one substrate is sectioned after completing the formation processing of a plural number of panels on the substrate.

In embodiment 6, an example of irradiating this kind of multiple substrate with a linear shape laser beam having a continuous light emission excimer laser emission device as a light source is shown. The size of the multiple substrate is 600 mm×720 mm throughout embodiment 6.

Many methods of irradiating a linear shape laser on a multiple substrate can be considered, and a typical one is given and explained in embodiment 6.

Figure 9:
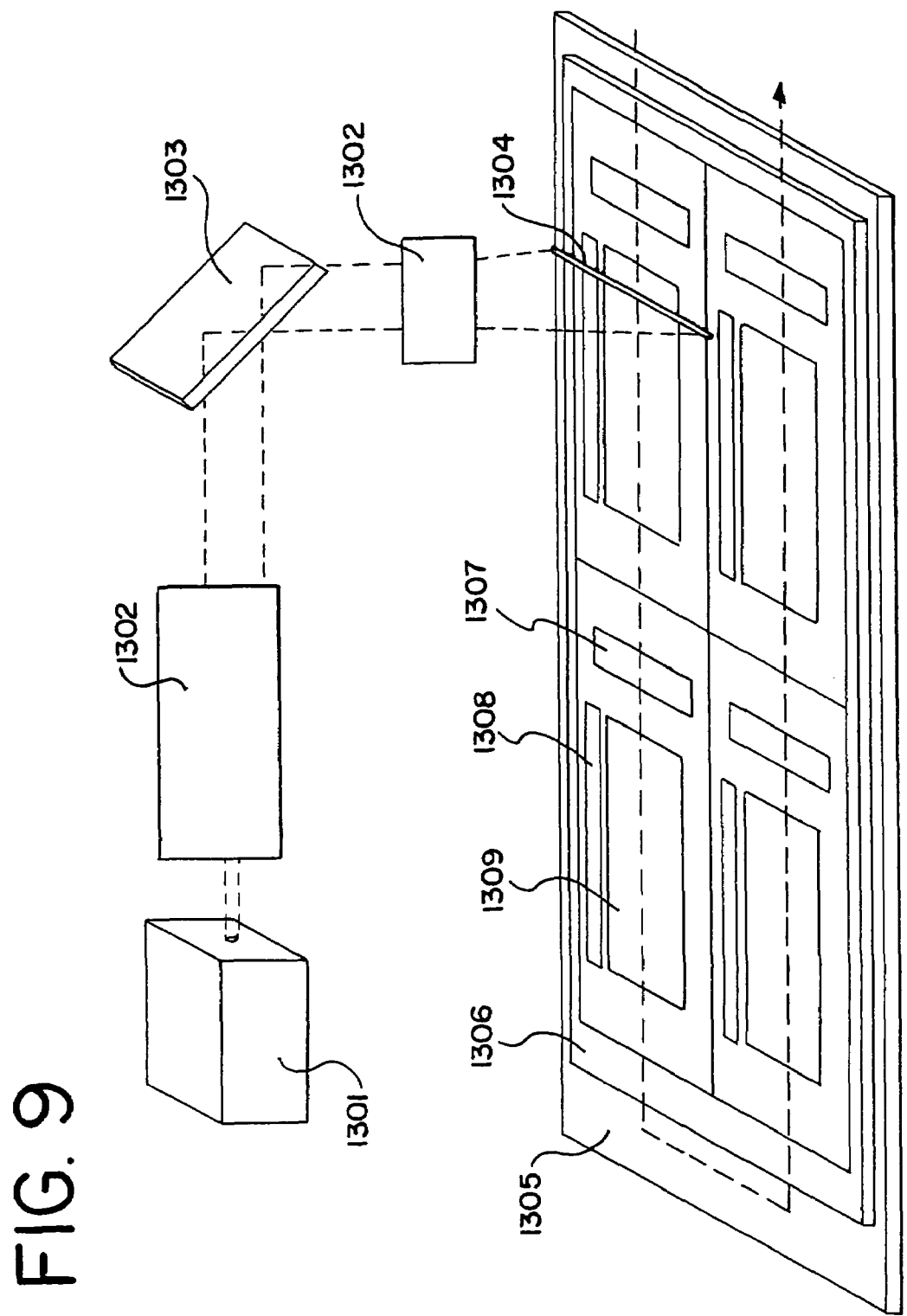
FIG. 9 is a diagram showing the state of a laser irradiation for the multiple substrate of Embodiment 6.

The method used in embodiment 6 is shown in FIG. 9. The laser light emitted from a continuous light emission excimer laser emission device 1301 is made into a linear shape laser beam 1304 on an irradiation surface (a substrate 1306) by passing through an optical system 1302 and a mirror 1303. One of the examples shown in the previous embodiment, for example, that shown in FIG. 8, is used in the optical system 1302.

A 5×6 array of 3.5 inch liquid crystal panels, for a total of 30 panels, are formed on the substrate 1306 in embodiment 6. The size of the multiple substrate is 600 mm×720 mm, so one panel is enclosed in a square region 120 mm×120 mm. For simplicity, only four liquid crystal panels are shown in FIG. 9. A region 1307 which becomes a source driver, a region 1308 which becomes a gate driver, and a region 1309 which becomes a pixel are shown for one liquid crystal panel.

The length of the linear shape laser beam formed by the optical system shown in FIG. 8 is 125 mm, so this is longer than the length of a side of a region enclosing one panel (a 120 mm square). Therefore, a one column region of panels can be processed by scanning the linear shape laser beam only one time in one direction. The panels are arranged in five columns by six rows on the multiple substrate 1306, so the entire substrate surface can be laser irradiated by scanning five times. Scanning of the substrate is performed by moving an XY stage 1305. The substrate scanning direction, for example, is in the direction shown by the dotted linear arrow in FIG. 9.

Note that while only four liquid crystal panels are shown in FIG. 9, there is of course no special limit.

Embodiment 7

Another example of irradiating a multiple substrate with a linear shape laser beam having a continuous light emission excimer laser emission device as a light source is shown in embodiment 7. The size of the multiple substrate is 600 mm×720 mm throughout embodiment 7.

The method used in embodiment 7 is shown in FIG. 10. The laser light emitted from a continuous light emission excimer laser emission device 1401 is made into a linear shape laser beam 1404 on an irradiation surface (a substrate 1406) by passing through an optical system 1402 and a mirror 1403. One of the examples shown in the previous embodiment, for example, that shown in FIG. 8, is used in the optical system 1402.

A 10×12 array of 2.6 inch liquid crystal panels, for a total of 120 panels, are formed on the substrate 1406 in embodiment 7. The size of the multiple substrate is 600 mm×720 mm, so one panel is enclosed in a square region 60 mm×60 mm. For simplicity, only four liquid crystal panels are shown in FIG. 10. A region 1407 which becomes a source driver, a region 1408 which becomes a gate driver, and a region 1409 which becomes a pixel are shown for one liquid crystal panel.

The length of the linear shape laser beam formed by the optical system shown in FIG. 8 is 125 mm, so this is longer than the length of the above four panels arranged in 2 columns by 2 rows (a 120 mm square). Therefore, two column regions of panels can be processed by scanning the linear shape laser beam only one time in one direction. The panels are arranged in 10 columns by 12 rows on the multiple substrate 1406, so the entire substrate surface can be laser irradiated by scanning five times. Scanning of the substrate is performed by moving an XY stage 1405. The substrate scanning direction, for example, is in the direction shown by the dotted line arrow in FIG. 10.

The longer the length of the linear shape laser beam becomes, or the smaller the panels become, the more the number of panels that can be laser irradiated by one scan of the linear shape laser beam increases. Depending upon the length of the linear shape laser beam and the panel size, three columns or more can be laser irradiated by a single scan of the linear shape laser beam.

Note that while only four liquid crystal panels are shown in FIG. 10, there is of course no special limit.

Embodiment 8

An example of the manufacture of a TFT (thin film transistor) using the crystalline silicon film obtained in embodiment mode 1 of the present invention, or any of the above embodiments, is shown in embodiment 8. The processes of embodiment 8 are shown in FIGS. 11A to 13C.

A glass substrate 701 is first prepared as a substrate, and a 200 nm thick silicon oxide film (also called a base film) 702 and a 55 nm thick amorphous silicon film 703*a* are deposited on top in succession, without exposure to the atmosphere. (See FIG. 11A.) Doing so can prevent the adsorption of impurities such as boron, which present in the atmosphere, on the lower surface of the amorphous silicon film 703*a*.

Note that an amorphous silicon film is used as an amorphous semiconductor film in embodiment 8, but other semiconductor films may also be used. An amorphous silicon germanium film is also fine. In addition, PCVD, LPCVD, or sputtering may be used as the formation means for the base film and the semiconductor film. For cases in which the hydrogen concentration is high, heat treatment may be performed next in order to reduce the hydrogen concentration.

Crystallization of the amorphous silicon film 703*a* is performed next. Laser crystallization using the laser irradiation technique shown in the embodiment mode of the present invention is performed in embodiment 8. Thus laser irradiation is performed, causing crystallization, and forming a region 704*a* from a crystalline silicon (polysilicon) film. (See FIG. 11B.)

The crystalline silicon (polysilicon) film formed is then patterned, forming a semiconductor layer 704*b* of a TFT. (See FIG. 11C.)

Note that the doping of an impurity element (phosphorous or boron) into the crystalline silicon film may be performed before or after the formation of the semiconductor layer 704*b* in order to control the TFT threshold voltage. This process may be performed on only an NTFT or a PTFT, or may be performed on both.

An insulating film 705 is formed next by sputtering or plasma CVD, and a first conductive film 706*a* and a second conductive film 707*a* are laminate formed by sputtering. (See FIG. 11D.)

The insulating film 705 is an insulating film functioning as a TFT gate insulating film, and its film thickness is set between 50 and 200 nm. A 100 nm thick silicon oxide film is formed in embodiment 8 by sputtering using a silicon oxide as a target. In addition, not only a silicon oxide film, but a laminate structure of a silicon nitride film formed on a silicon oxide film can be used, and a silicon nitride oxide film in which nitrogen is doped into a silicon oxide film may be used.

Note that an example is shown in embodiment 8 in which patterning is performed and a gate insulating film is formed after performing laser crystallization of the amorphous silicon film, there are no special limitations on process order, and a process may be used in which laser crystallization and then patterning are performed after depositing an amorphous silicon film and a gate insulating film in succession by sputtering. Good interface characteristics can be obtained with successive deposition by sputtering.

In addition, the first conductive film 706*a* is made from a conductive material containing as a main component an element selected from Ta, Ti, Mo, and W. The first conductive film 706*a* may be formed with a thickness of 5 to 50 nm, preferably between 10 and 25 nm. On the other hand, a conductive material with Al, Cu, or Si as its main component is used for the second conductive film 707*a*. The second conductive film 707*a* may be formed with a thickness of 100 to 1000 nm, preferably between 200 and 400 nm. The second conductive film 707*a* is formed in order to reduce the resistance of a gate wiring or a gate bus line wiring.

Unnecessary areas of the second conductive film 707*a* are removed next by patterning, forming an electrode 707*b* which becomes a portion of the gate bus line in the wiring section. Resist masks 708*a* to 708*d* are formed afterward. The resist mask 708*a* is formed to cover the PTFT, and the resist mask 708*b* is formed to cover a channel forming region of a driver circuit NTFT. In addition, the resist mask 708*c* is formed to cover the electrode 707*b*, and the resist mask 708*d* is formed to cover a channel forming region of a pixel portion. Doping of an impurity element which imparts n-type conductivity is performed with the resist masks 708*a* to 708*d* as masks, forming impurity regions 710 and 711. (See FIG. 12A.)

Phosphorous is used as an n-type conductivity imparting impurity element in embodiment 8, and ion doping using phosphine ($PH_3$) is performed. The acceleration voltage is set high at 80 keV for this process in order to dope phosphorous through the gate insulating film 705 and through the first conductive film 706*a*, and into the semiconductor layer 704*b* below. The concentration of phosphorous doped into the semiconductor layer 704*b* is preferably in the range of from $1 \times 10^{16}$ to $1 \times 10^{19}$ atoms/cm$^3$, and is set to $1 \times 10^{18}$ atoms/cm$^3$ here. Thus the regions 710 and 711 in which phosphorous is doped are formed in the semiconductor layer. A portion of the phosphorous doped region formed here functions as an LDD region. In addition, a portion of the regions covered with masks into which phosphorous is not doped (regions 709 and 712 from the crystalline silicon film) functions as a channel forming region.

Note that an ion implantation, in which separation of mass is performed, may be used for the phosphorous doping process, and that plasma doping, in which separation of mass is not performed, may be used. Furthermore, conditions such as acceleration voltage and dose amount may be optimally set by the user.

Next, the resist masks 708a to 708d are removed, and an activation process is performed if necessary. Then a third conductive film 713a is deposited by sputtering. (See FIG. 12B.) The third conductive film 713a is a conductive material containing as a main component selected from Ta, Ti, Mo, and W. Further, the thickness of the third conductive film 713a is between 100 and 1000 nm, preferably from 200 to 500 nm.

Resist masks 714a to 714d are newly formed next, and patterning is performed, forming gate electrodes 706b and 713b of the PTFT, and wirings 706c and 713c. An impurity element which imparts p-type conductivity is doped next using the masks 714a to 714d as is, forming a source region and a drain region of the PTFT. (See FIG. 12C.) Boron is used here as the impurity element, and is doped by ion doping using diborane ($B_2H_6$). The acceleration voltage is also set to 80 keV, and boron is doped to a concentration of $2 \times 10^{20}$ atoms/cm$^3$ here.

The resist masks 714a to 714d are removed next, and resist masks 718a to 718e are newly formed. Afterward, etching is performed using the resist masks 718a to 718e as masks, forming gate wirings 706d and 713d of the NTFT, gate wirings 706e and 713e of the pixel portion TFT, and upper wirings 706f and 713f of a storage capacitor. (See FIG. 12D.) After removing the resist masks 718a to 718e and forming new resist masks 719, an impurity element which imparts n-type conductivity is doped into the source region and drain region of the NTFT, forming impurity regions 720 to 725. (See FIG. 13A.) Ion doping using phosphine ($PH_3$) is performed here. The concentration of phosphorous doped into the impurity regions 720 to 725 is higher compared to the concentration in the previous doping process in which an n-type conductivity imparting impurity element is doped, is preferably between $1 \times 10^{19}$ and $1 \times 10^{21}$ atoms/cm$^3$, and is set to $1 \times 10^{20}$ atoms/cm$^3$ here.

Figure 13A:
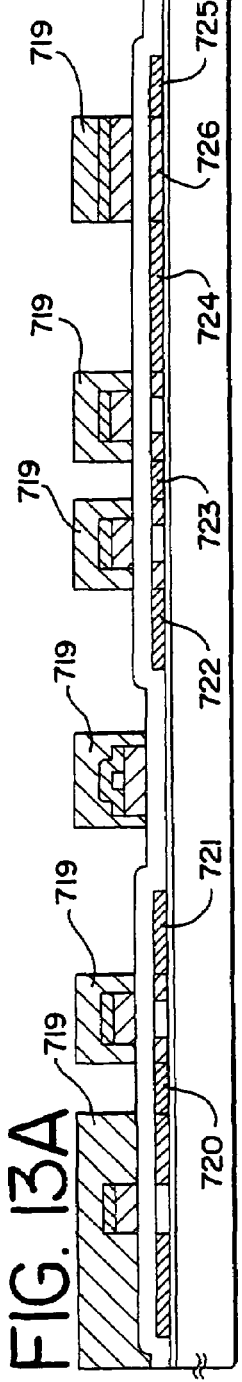
FIGS. 13A to 13C are diagrams showing the manufacturing process of an AM-LCD of Embodiment 8.
Figure 13B:
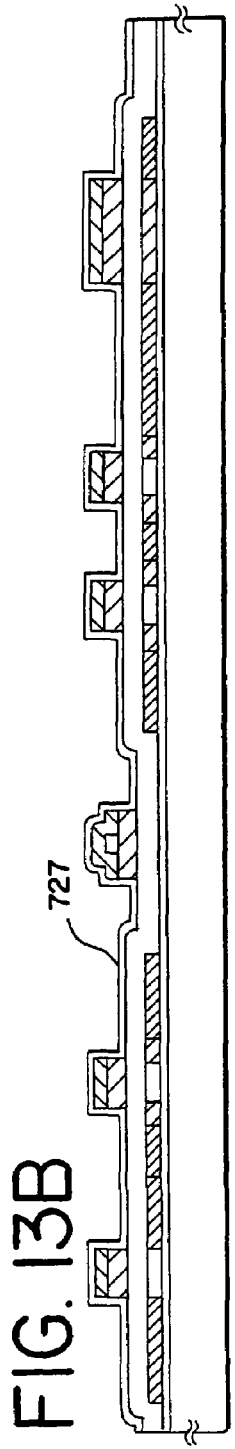

After next removing the resist masks 719, the state of FIG. 13B can be obtained by forming a protection film 727 from a 50 nm thick silicon nitride film.

An activation process is next performed in order to activate the doped impurity elements which impart n-type or p-type conductivity. Thermal annealing using an electric furnace, laser annealing using the above excimer laser, or rapid thermal annealing (RTA) using a halogen lamp may be performed for this process. The temperature is set to between 300 and 700□, preferably from 350 to 550□, for heat treatment processing. Heat treatment is performed in embodiment 8 in a nitrogen atmosphere at 450□ for two hours.

Next, a contact hole is formed after forming a first interlayer insulating film 730. Then, source electrodes and drain electrodes 731-735 are formed with a known technique.

A passivation film 736 is formed next. A silicon oxide film, a silicon nitride oxide film, an silicon oxide nitride film, or a laminate film of these insulating films and a silicon oxide film can be used as the passivation film 736. A 300 nm thick silicon nitride film is used in embodiment 8 as the passivation film.

Note that plasma processing is performed in embodiment 8 using ammonia gas as a pre-process before forming the silicon nitride film, and that the passivation film 736 is then formed as is. The hydrogen which is activated (excited) by the plasma in this pre-process is locked up by the passivation film 736, so hydrogen termination of the TFT active layer (semiconductor layer) can be promoted.

In addition, if a gas containing hydrogen and a nitrogen monooxide gas are added, the surface of the body to be processed is cleaned by moisture generated, and contamination especially due to boron, etc., contained in the atmosphere can be effectively prevented.

Figure 13C:
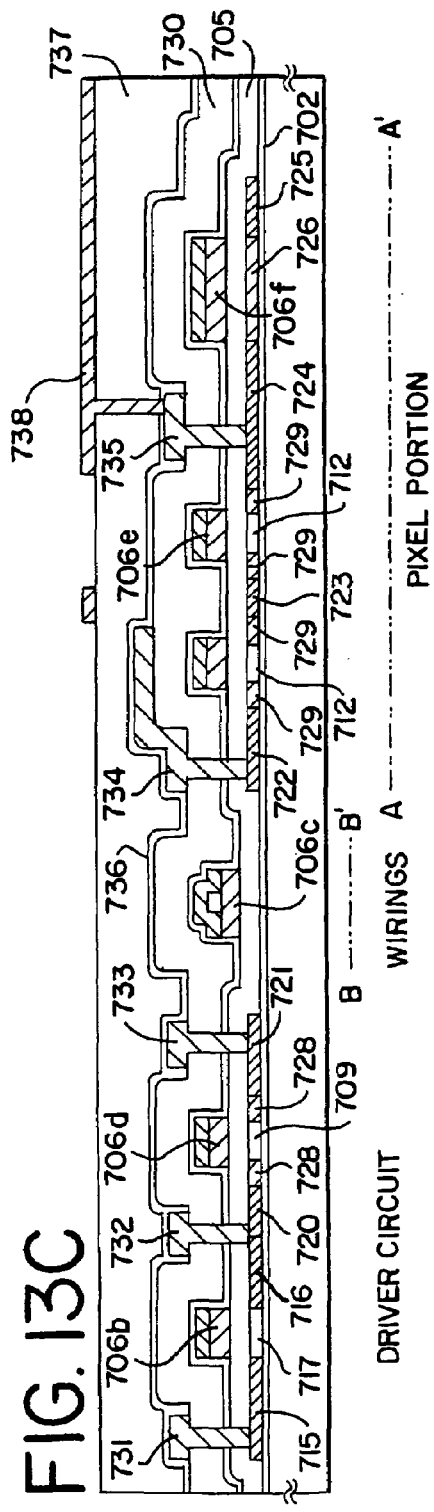

After forming the passivation film 736, a 1 μm thick acrylic film is formed as a second interlayer insulating film 737, patterned, a contact hole is formed, and a pixel electrode 738 is formed from an ITO film. Thus an AM-LCD with the structure shown in FIG. 13C is completed.

The channel forming region 709, the impurity regions 720 and 721, and a LDD region 728, are formed in the driver circuit NTFT by the above processes. The impurity region 720 becomes a source region, and the impurity region 721 becomes a drain region. In addition, the channel forming region 712, the impurity regions 722 to 725, and an LDD region 729 are formed in the pixel portion NTFT. Each of the LDD regions 728 and 729 has portions to overlap the gate electrode (GOLD region), and not to overlap the gate electrode (LDD region).

On the other hand, a channel forming region 717, and impurity regions 715 and 716 are formed in the p-channel type TFT. The impurity region 715 then becomes a source region, and the impurity region 716 becomes a drain region.

If a TFT manufactured using semiconductor films formed in accordance with the above method is used, for example, when manufacturing a liquid crystal display device, then a device can be obtained in which the laser processing marks do not stand out compared to the conventional. This is due to the suppression of dispersion in the characteristics of individual TFTs, especially of dispersion of the mobility.

Figure 14A:
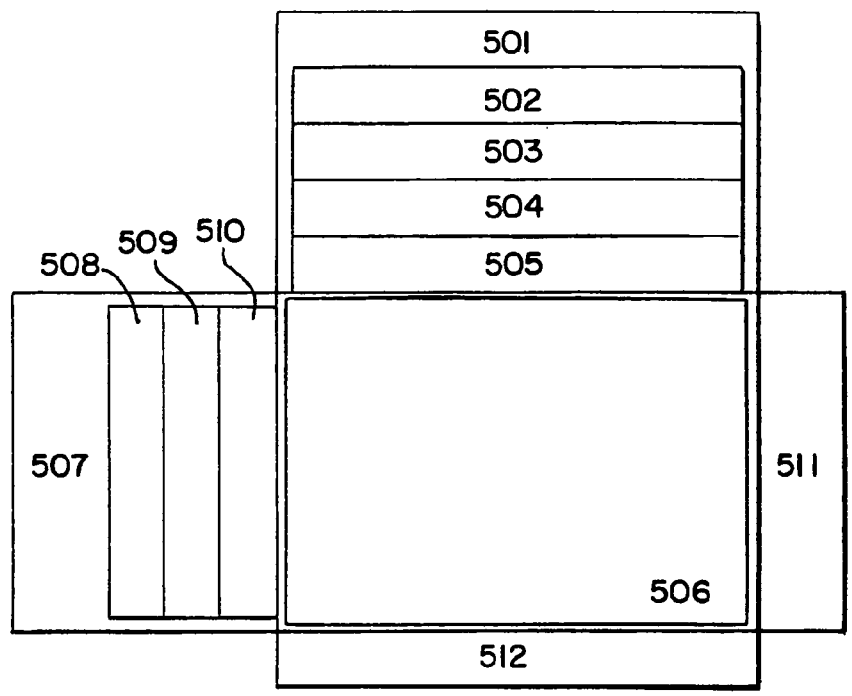
FIGS. 14A and 14B are diagrams showing an upper surface view and the circuit arrangement of a pixel portion of Embodiment 8.

An example of the circuit structure of an active matrix type liquid crystal display device is shown in FIG. 14A. The active matrix type liquid crystal display device of embodiment 8 possesses a source signal line side driver circuit 501, a gate signal line side driver circuit (A) 507, a gate signal line side driver circuit (B) 511, a pre-charge circuit 512, and a pixel portion 506.

The source signal line side driver circuit 501 is provided with a shift register circuit 502, a level shifter circuit 503, a buffer circuit 504, and a sampling circuit 505.

In addition, the gate signal line side driver circuit (A) 507 is provided with a shift register circuit 508, a level shifter circuit 509, and a buffer circuit 510. The gate signal line side driver circuit (B) 511 is also structured similarly.

Furthermore, an optimal shape for the TFTs which structure each of the circuits can be built in with the present invention by the same process, because it is easy to differ the length of the LDD regions on the same substrate by considering the NTFT driver voltages.

Figure 14B:
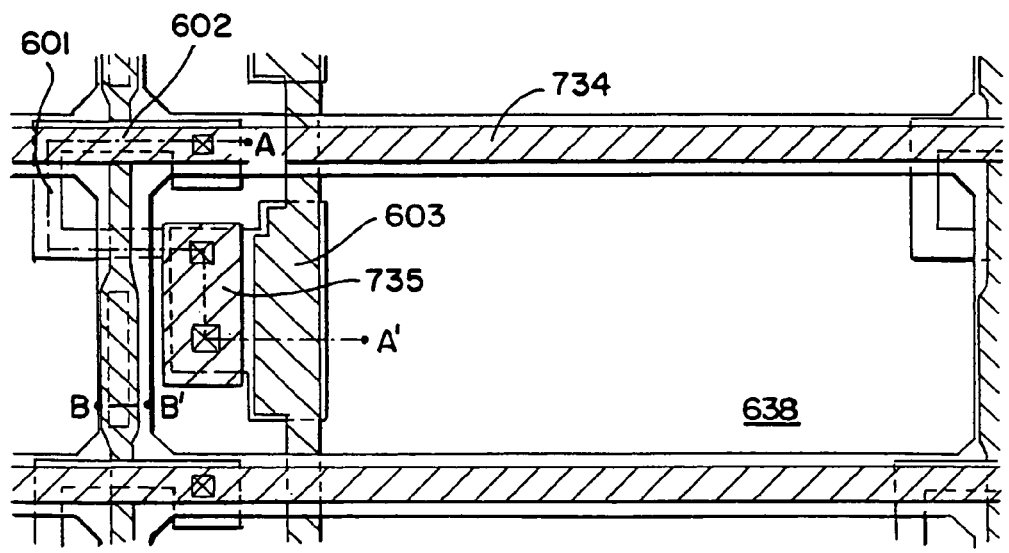

In addition, FIG. 14B shows an upper surface diagram of the pixel portion, and the cross sectional structure of the TFT taken along the lines of A-A' and that of the wirings taken along the line of B-B' correspond to FIG. 13C, so some of the same symbols are used. In FIG. 14B, reference numeral 601 denotes a semiconductor layer, 602 denotes a gate electrode, and 603 denotes a capacitor line. The gate electrodes and the gate wirings, formed from first conducting layers and third conducting layers, and the gate bus lines, formed from first conductive layers, second conductive layers, and third conductive layers, possess a clad structure in embodiment 8.

Figure 15A:
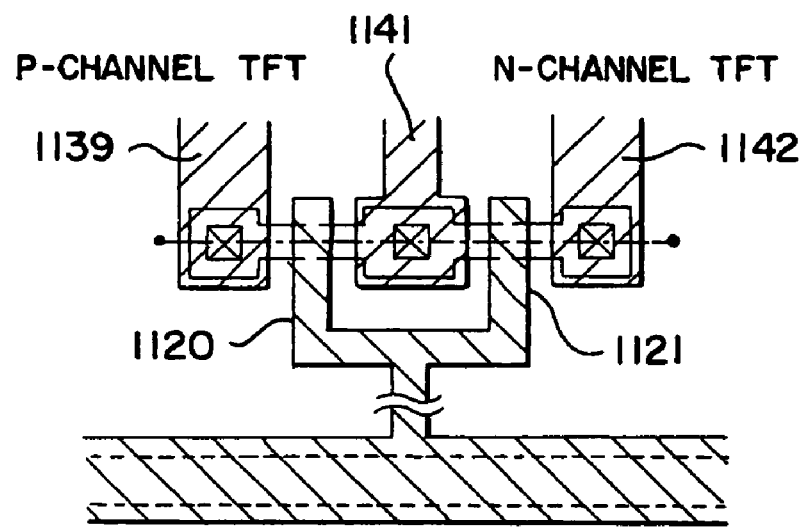
FIGS. 15A and 15B are diagrams showing the upper surface view of a CMOS circuit of Embodiment 8.
Figure 15B:
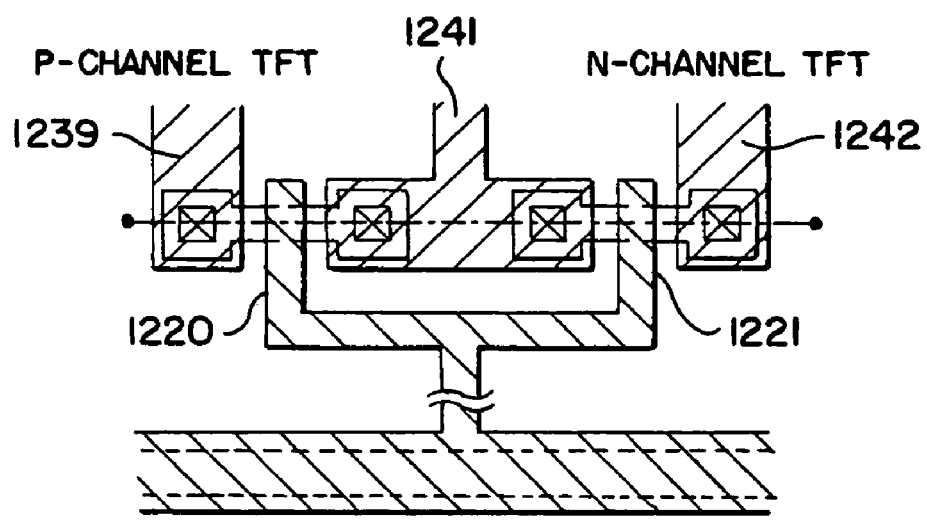
Figure 17A:
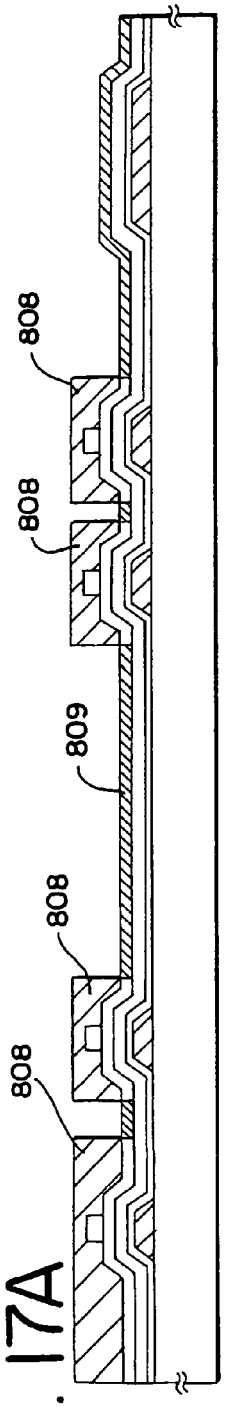
FIGS. 17A to 17D are diagrams showing the manufacturing process of an AM-LCD of Embodiment 9.
Figure 17B:
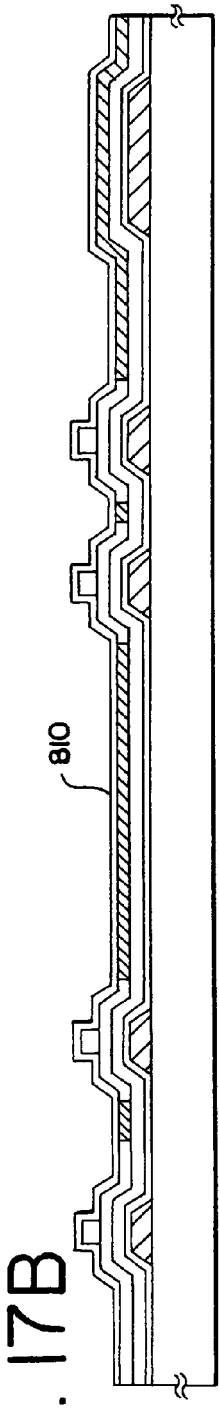
Figure 17C:
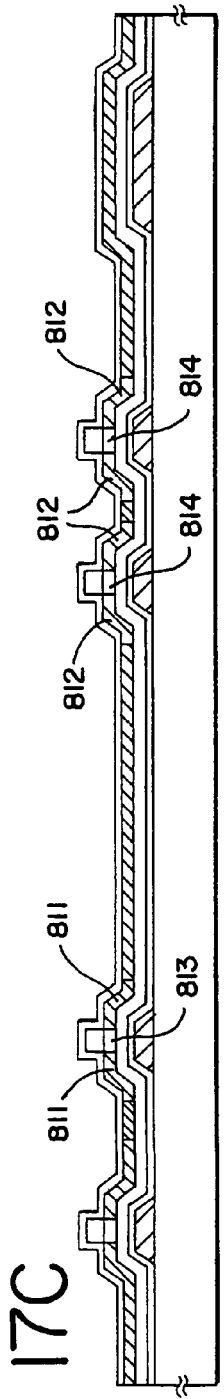
Figure 17D:
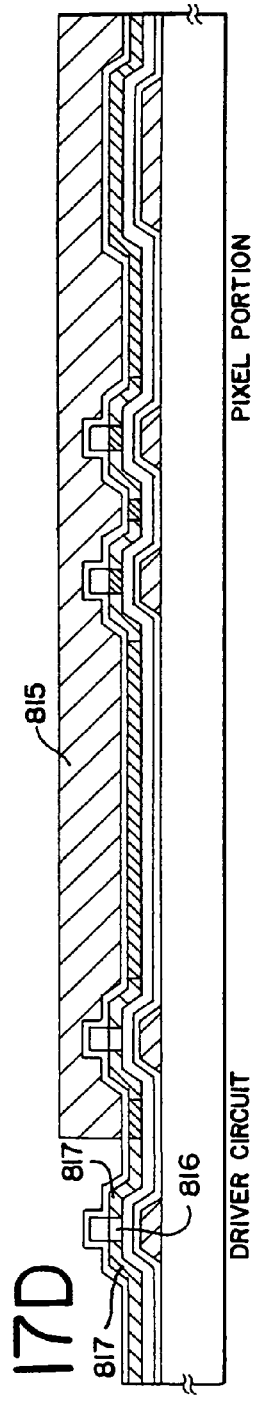

In addition, FIG. 15A shows an upper surface diagram of a CMOS circuit that becomes a portion structuring the driver circuit, and corresponds to FIG. 13C. Reference numeral 1139 denotes a source electrode and 1141 denotes a drain electrode of a PTFT, 1142 denotes a source electrode of an NTFT, and 1120 and 1121 denote gate wirings. Furthermore, although the active layers of the NTFT and the PTFT are in direct contact in embodiment 8, and the drain electrodes are shared, there are no particular limitations on this structure, and the structure shown in FIG. 15B (a structure in which the active layers are completely separated) may be used. Note that in FIG. 15B, reference numeral 1239 denotes a PTFT source electrode, 1241 denotes a drain electrode, 1241 denotes an NTFT source electrode, and 1220 and 1221 denote gate wirings.

In addition, the constitution of embodiment 8 can be freely combined with the composition of any of embodiments 1 to 7.

Embodiment 9

FIGS. 16A to 18C are used in embodiment 9 to explain an example of the manufacture of an AM-LCD using processes different from those of embodiment 8. An example of a top gate type TFT is shown in embodiment 8, but an example of a bottom gate type structure is shown in embodiment 9.

First, a laminate structure (for simplicity, this is not shown in the figures) gate electrode 802 is formed on a glass substrate 801. A tantalum nitride film and a tantalum film are deposited by using sputtering in embodiment 9, and gate wirings (including gate electrodes) 802a to 802c and a capacitor wiring 802d are formed using a known patterning technique.

A gate insulating film and an amorphous semiconductor film are next deposited in order without exposure to the atmosphere. A laminate of a silicon nitride film and a silicon oxide film is formed by sputtering in embodiment 9, and a gate insulating film with a laminate structure is formed. (See FIG. 16A.) An amorphous silicon film is formed next without exposure to the atmosphere. Heat treatment may be performed afterward in order to reduce the hydrogen concentration.

Laser crystallization is performed next, forming a crystalline silicon film 806. In embodiment 9, the amorphous semiconductor film is irradiated with laser light using the laser irradiation method shown in the embodiment mode of the present invention. (See FIG. 16B.)

A channel protection film 807 for protecting the channel forming region is formed next. The channel protection film 807 may be formed using a known patterning technique. Patterning is performed in embodiment 9 using a photo mask. In this state, the surface of the crystalline silicon film, except for the regions contacting the channel protection film 807, are exposed. (See FIG. 16C.) Furthermore, the photo mask is not necessary in cases where patterning is done using exposure from the back surface, so the number of process steps can be reduced.

A resist mask 808, coving a portion of the PTFT and the NTFT, is formed next by patterning the photo mask. Doping of an impurity element which imparts n-type conductivity (phosphorous is used in embodiment 9) is then performed, forming an impurity region 809. (See FIG. 17A.)

After next removing the resist mask 808, the entire surface is covered by an insulating film 810 with a thin film thickness. The thin insulating film 810 is formed in order to dope a low concentration of an impurity element, and is not especially necessary. (See FIG. 17B.)

An impurity element with a low concentration, compared to the previous impurity element doping process, is doped next. (See FIG. 17C.) Thus the crystalline silicon film covered by the channel protection film 807b becomes a channel forming region 813, and the crystalline silicon film covered by the channel protection film 807c becomes a channel forming region 814 in accordance with this process. In addition, LDD regions 811 and 812 of the NTFT are formed by this process.

A resist mask 815 is formed next to cover the entire surface of the n-channel type TFT, and an impurity element which imparts p-type conductivity is doped. (See FIG. 17D.) Thus the crystalline silicon film covered by the channel protection film 807a becomes a channel forming region 816 of the PTFT in accordance with this process, and a source and drain region 817 of the PTFT is formed by this process.

After next removing the resist mask 815, the semiconductor layers are patterned into the desired shape. (See FIG. 18A.) Here, reference numeral 818 indicates a source region of the PTFT of the driver circuit; 819, a source region of the NTFT of the driver circuit; 820, a source region of the NTFT of the pixel portion; and 821, a drain region of the NTFT of the pixel portion and a capacitor electrode.

Next, after forming a first interlayer insulating film 822, a contact hole is formed, and source electrodes and drain electrodes 823 to 827 are formed by a known technique.

A passivation film 828 is formed afterward. A silicon nitride film, a silicon nitride oxide film, a silicon oxide nitride film, or a laminate film of these insulating films and a silicon oxide film can be used as a passivation film 828. A 300 nm thick silicon nitride film is used as the passivation film in embodiment 9. (See FIG. 18B.)

Note that plasma processing is performed in embodiment 9 using ammonia gas as a pre-process before forming the silicon nitride film, and that the passivation film 828 is then formed as it is. The hydrogen which is activated (excited) by the plasma in this pre-process is locked up by the passivation film 828, so hydrogen termination of the TFT activation layer (semiconductor layer) can be promoted.

After forming the passivation film 828, a 1 µm thick acrylic film is formed as a second interlayer insulating film 829, a contact hole is formed by patterning, and a pixel electrode 830 is formed from an ITO film. Thus an AM-LCD with the structure shown in FIG. 18C is completed.

If a TFT manufactured using semiconductor films formed in accordance with the above method is used, for example, when manufacturing a liquid crystal display device, then a device can be obtained in which the laser processing marks do not stand out compared to the conventional. This is due to the suppression of dispersion in the characteristics of individual TFTs, especially of dispersion of the mobility.

In addition, the constitution of embodiment 9 can be freely combined with the constitution of any of embodiments 1 to 7.

Embodiment 10

A case is explained in embodiment 10 in which a different means is used to form the crystalline silicon film of embodiment 8.

Nickel is selected as a catalytic element in embodiment 10, a layer containing nickel is formed on an amorphous silicon film, and after heat treatment (atmosphere of at 550□ for 4 hours), crystallization is performed by conducting the laser irradiation processes shown in the embodiment mode of the present invention.

A resist mask is formed next on the silicon film, and a periodic table group 15 element (phosphorous is used in embodiment 10) doping process is performed. It is preferable that the concentration of the doped phosphorous be between $5\times10^{18}$ and $1\times10^{20}$ atoms/cm$^3$ (more preferably from $1\times10^{19}$ to $5\times10^{19}$ atoms/cm$^3$). However, the required concentration of phosphorous changes in accordance with the temperature of a later gettering process, with its process time, and in addition, with the surface area of the phosphorous doped region, so the concentration is not limited to this range. Thus regions into which phosphorous has been doped (hereinafter called phosphorous doped regions) are formed.

The resist mask is placed so as to expose a portion of (or all of) a region which later becomes a source region or a drain region of a driver circuit TFT. In addition, in the similar manner the resist mask is placed so as to expose a portion of (or all of) a source region or a drain region of a pixel TFT. The resist mask is not placed in a region which becomes a lower electrode of a storage capacitor at this point, so phosphorous is doped over this entire surface, forming a phosphorous doped region.

The resist mask is removed next, gettering of the catalytic element (nickel in embodiment 10) used in crystallization of the silicon film is performed by heat treatment at between 500 and 650□ for 2 to 16 hours. In order to produce a gettering action, a temperature of within ±50□ of the maximum temperature in the thermal history is required. Heat treatment for crystallization is performed at between 550 and 600□, so heat treatment at 500 to 650□ can be sufficient to produce a gettering action.

The crystalline silicon (polysilicon) film with a reduced catalytic element concentration is then patterned, forming a TFT crystalline semiconductor layer. Further processing may be performed in accordance with embodiment 8.

Note that it is possible to freely combine the constitution of embodiment 10 with the constitution of any of embodiments 1 to 9.

Embodiment 11

It is possible to use the present invention when forming an interlayer insulating film on a conventional MOSFET, and then forming a TFT thereon. In other words, it is possible to realize a semiconductor device with a three dimensional structure in which a reflective type AM-LCD is formed on a semiconductor circuit.

In addition, the semiconductor circuit may be formed on an SOI substrate by SIMOX, Smart-Cut (a registered trademark of SOITEC corporation), ELTRAN (a registered trademark of Cannon, Inc.), etc.

Note that a combination of the constitutions of any of embodiments 1 to 10 may be used when carrying out embodiment 11.

Embodiment 12

The case of forming a TFT on a substrate by the manufacturing processes shown in embodiment 8, and actually manufacturing an AM-LCD is explained in embodiment 12.

After obtaining the state of FIG. 13C, an 80 nm thick alignment film is formed on the pixel electrode 738. A color filter, a transparent electrode (opposing electrode), and an alignment film are formed on a glass substrate prepared as an opposing substrate, and a rubbing process is performed for each alignment film. The substrate on which the TFT is formed and the opposing substrate are then joined together using a sealing material (sealant). A liquid crystal material is then maintained therebetween. A known means may be used for the cell construction, so a detailed explanation is omitted.

The following can be given as examples of the above liquid crystal material: a TN liquid crystal; PDLC; a ferroelectric liquid crystal; an anti ferroelectric liquid crystal; and a mixture of a ferroelectric liquid crystal and an antiferroelectric liquid crystal. In addition, it is possible to use the liquid crystal materials disclosed in: H. Furue et al., "Characteristics and Driving Scheme of Polymer-stabilized Monostable FLCD Exhibiting Fast Response Time and High Contrast Ratio with Gray-scale Capability," SID, 1998; T. Yoshida et al., "A Full-color Thresholdless Antiferroelectric LCD Exhibiting Wide Viewing Angle with Fast Response Time," SID Digest, 841, 1997; and U.S. Pat. No. 5,594,569.

In particular, among thresholdless antiferroelectric liquid crystal materials and thresholdless antiferroelectric mixed liquid crystal materials which are liquid crystal materials mixed from a ferroelectric liquid crystal material and an antiferroelectric liquid crystal material, materials that have a driver voltage on the order of ±2.5 V stand out. When this kind of low driver voltage thresholdless antiferroelectric mixed liquid crystal is used, it is possible to limit the power supply voltage of the image signal sampling circuit on the order of 5 to 8 V, so this is effective for cases using a TFT with a relatively small width LDD region (for example, between 0 and 500 nm, or between 0 and 200 nm).

Note that a low voltage driver is realized by using a thresholdless antiferroelectric mixed liquid crystal, so a liquid crystal display device which has been made low power consumption is realized.

Note also that spacers may optionally be attached in order to maintain a cell gap. Therefore, spacers do not need to be attached for cases when the call cap can be maintained without spacers, as for an AM-LCD with a 1 inch diagonal or less.

Figure 20:
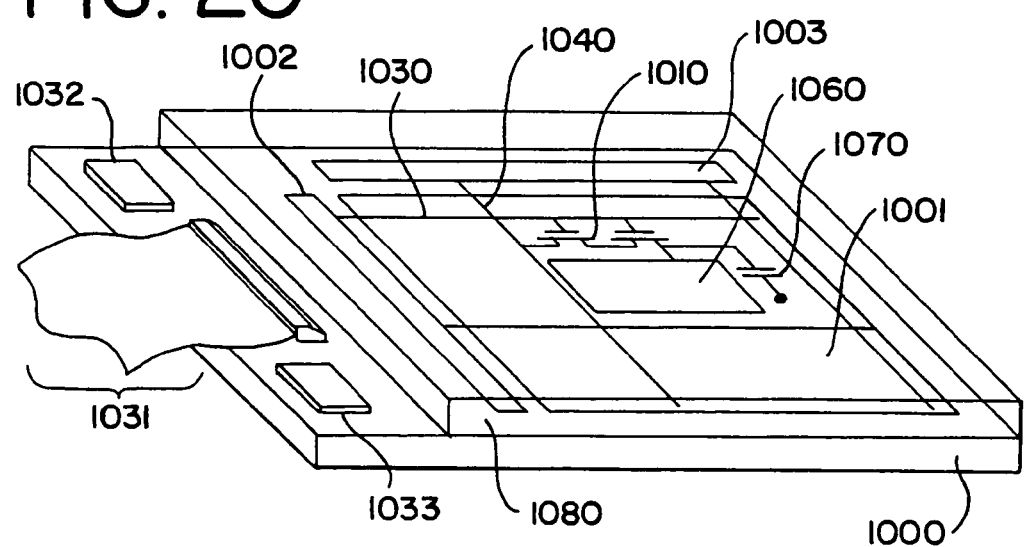
FIG. 20 is a diagram showing an external view of an AM-LCD of Embodiment 12.

Next, an external view of an AM-LCD manufactured as above is shown in FIG. 20. An active matrix substrate and an opposing substrate are opposing, as shown in FIG. 20, and a liquid crystal is sandwiched between the substrates. The active matrix substrate has a pixel portion 1001, a scanning line driver circuit 1002, and a signal line side driver circuit 1003 formed on a substrate 1000.

The scanning line driver circuit 1002 and the signal line side driver circuit 1003 are connected to the pixel portion 1001 by scanning lines 1030 and signal lines 1040, respectively. The driver circuits 1002 and 1003 are principally structured by CMOS circuits.

The scanning lines 1030 are formed for each row of the pixel portion 1001, and signal lines 1040 are formed for each column. Pixel TFTs 1010 are formed near the intersections of the scanning lines 1030 and the signal lines 1040. The gate electrodes of the pixel TFTs 1010 are connected to the scanning lines 1030, and the sources are connected to the signal lines 1040. In addition, pixel electrodes 1060 and storage capacitors 1070 are connected to the drains.

A transparent conductive film such as an ITO film is formed over the entire substrate surface of an opposing substrate 1080. The transparent conductive film is an opposing electrode for the pixel electrodes 1060 of the pixel portion 1001, and the liquid crystal material is driven by the electric field formed between the pixel electrodes and the opposing electrode. An alignment film, a black mask, or a color filter may be formed on the opposing substrate 1080 if necessary.

IC chips 1032 and 1033 are installed to the substrate on the active matrix substrate side, on the face to which an FPC 1031 is installed. The IC chips 1032 and 1033 are structured with circuits such as video signal processing circuits, timing pulse generation circuits, γ correction circuits, memory circuits, and computation circuits formed on a silicon substrate.

In addition, an example of a liquid crystal display device is given and explained in embodiment 12, but it is possible to apply the present invention to an EL (electroluminescence) display device, or to an EC (electrochromic) display device, provided that it is an active matrix type display device.

Figure 19:
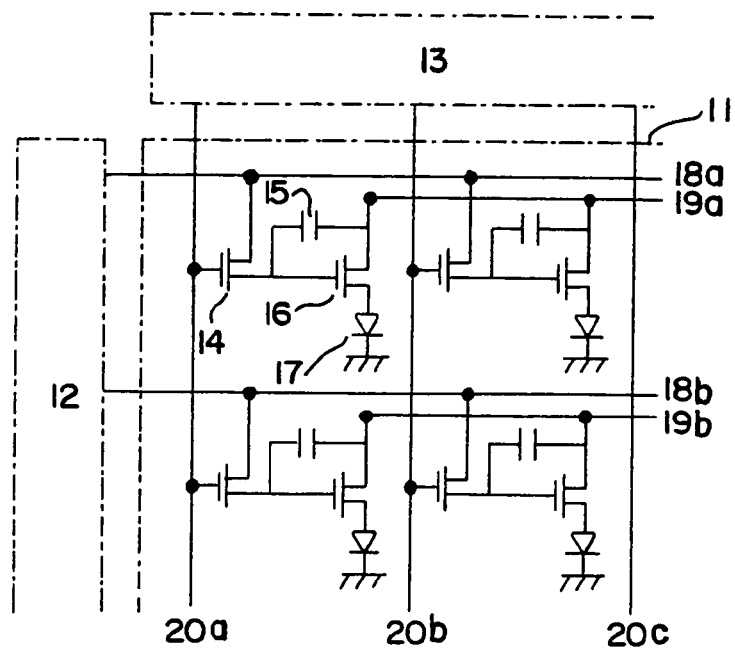
FIG. 19 is a circuit diagram of an active matrix type EL display device of Embodiment 12.

An example of an application to an active matrix type EL display device is shown in FIG. 19.

FIG. 19 is a circuit diagram of an active matrix type EL display device. Reference numeral 11 denotes a pixel portion, and an x-direction peripheral driver circuit 12 and a y-direction peripheral driver circuit 13 are formed in the surrounding area. In addition, each pixel of the pixel portion 11 has a switching TFT 14, a capacitor 15, a current control TFT 16, and an organic EL element 17, and an x-direction signal line 18a (or 18b), and a y-direction signal line 20a (or 20b, 20c) are connected to the switching TFT 14. Further, power supply lines 19a and 19b are connected to the current control TFT 16.

The structure of the TFTs used in the x-direction peripheral driver circuit 12 and the y-direction peripheral driver circuit 13 in the active matrix type EL display device of embodiment 12 is a GOLD structure, and the TFT structure of the switching TFT 14 and the current control TFT 16 is an LDD structure.

Figure 23A:
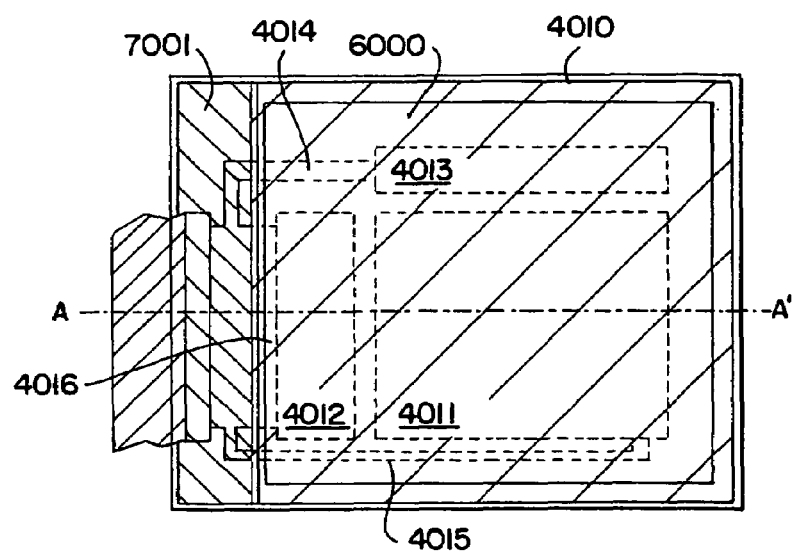
FIGS. 23A and 23B are external views of an active matrix type EL display device of Embodiment 12.

In addition, FIG. 23A is a top view of an EL display device using the present invention. In FIG. 23A reference numeral 4010 denotes a substrate, 4011 denotes a pixel portion, 4012 denotes a source side driver circuit, and 4013 denotes a gate side driver circuit. The drive circuits lead to an FPC 4017 through gate wirings 4014 to 4016, and thus connect to external equipment.

A cover material 6000, a sealing material (also called a housing material) 7000, and a sealant (a second sealing material) 7001 should be formed around at least the pixel portion at this point, and preferably around both the pixel portion and the drive circuits at this point.

Figure 23B:
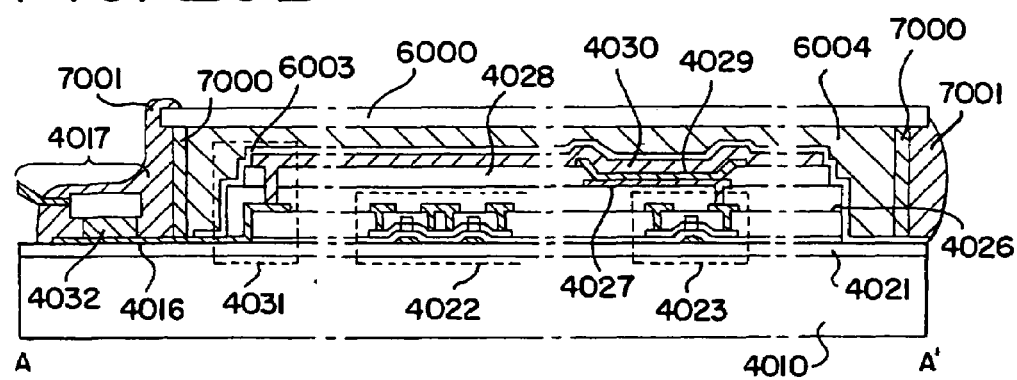

In addition, FIG. 23B is the cross sectional structure of the EL display device of embodiment 12. A driver circuit TFT 4022 (however, a CMOS circuit combining an n-channel type TFT and a p-channel type TFT is shown here) and a pixel TFT 4023 (however, only a TFT for controlling the current to an EL element is shown here) are formed on the substrate 4010 and a base film 4021. An example using a bottom gate type TFT, in accordance with the manufacturing method shown in embodiment 9, is shown here, but there are no particular limitations, and a known structure (top gate structure or bottom gate structure) may be used for the TFT.

After completing the driver circuit TFT 4022 and the pixel TFT 4023 using the present invention, a pixel electrode 4027 is formed by a transparent conductive film, on an interlayer insulating film (a flattening film) 4026 which is formed of a resin material, in order to electrically connect to the drain of the pixel TFT 4023. An indium oxide and tin oxide compound (called ITO), or an indium oxide and zinc oxide compound can be used as the transparent conductive film. Then, after forming the pixel electrode 4027, an insulating film 4028 is formed, and an open section is formed in the pixel electrode 4027.

An EL layer 4029 is formed next. Any known EL materials (hole injection layer, hole transport layer, illumination layer, electron transport layer, electron injection layer) may be freely combined and used in a laminate structure or a single layer structure. A known technique may be used to determine the structure type. Further, there are low molecular weight materials and high molecular weight materials (polymers) as EL materials. An evaporation method is used for low molecular weight materials, but it is possible to use an easy method such as spin coating, printing, or injecting for high molecular weight materials.

The EL layer is formed in embodiment 12 by an evaporation method using a shadow mask. By using the shadow mask and forming a luminescence layer that can emit different wavelengths of light for each pixel (red light emitting layer, green light emitting layer, and blue light emitting layer), color display is possible. Any other form may be used, such as combining color changing layers (CCM) with color filters, and combining white light emitting layers with color filters. Of course a single color light EL display device is also possible.

After forming the EL layer 4029, a cathode 4030 is formed on top. It is preferable to remove as much as possible of the moisture and oxygen existing in the interface between the cathode 4030 and the EL layer 4029. Therefore, it is necessary to form the EL layer 4029 and the cathode 4030 inside a vacuum by successive film deposition, or to form the EL layer 4029 in an inert atmosphere and then form the cathode 4030 without exposure to the atmosphere. It is possible to perform the above film deposition in embodiment 12 by using a multi-chamber system (cluster tool system) deposition device.

Note that a laminate structure of a LiF (lithium fluoride) film and an Al (aluminum) film is used for the cathode 4030 in embodiment 12. Specifically, a 1 nm thick LiF (lithium fluoride) film is formed on the EL layer 4029 by evaporation, and a 300 nm thick aluminum film is formed on top of that. Of course an MgAg electrode, a known cathode material, may be used. Then the cathode 4030 is connected to the wiring 4016 by the region denoted with the reference numeral 4031. The wiring 4016 is a power supply line in order to apply a preset voltage to the cathode 4030, and is connected to the FPC 4017 through a conductive paste material 4032.

The region denoted by reference numeral 4031 electrically connects the cathode 4030 and the wiring 4016, so it is necessary to form contact holes in the interlayer insulating film 4026 and the insulating film 4028. The contact holes may be formed during etching of the interlayer insulating film 4026 (when forming the pixel electrode contact hole) and during etching of the insulating film 4028 (when forming the open section before forming the EL layer). Further, etching may be proceeded in one shot all the way to the interlayer insulating film 4026 when etching the insulating film 4028. In this case the contact holes can have a good shape provided that the interlayer insulating film 4026 and the insulating film 4028 are the same resin material.

A passivation film 6003, a filling material 6004, and the cover material 6000 are formed, covering the surface of the EL element thus formed.

In addition, a sealing material is formed on the inside of the cover material 6000 and the substrate 4010, so as to surround the EL element section, and the sealant 7001 (the second sealing material) is formed on the outside of the sealing material 7000.

At this point the filling material 6004 also functions as an adhesive in order to bond the cover material 6000. PVC (polyvinyl chloride), epoxy resin, silicon resin, PVB (polyvinyl butyral), and EVA (ethylene vinyl acetate) can be used as the filling material 6004. If a drying agent is formed on the inside of the filling material 6004, a moisture absorption effect can be maintained, so this is preferable.

In addition, spacers may be included within the filling material 6004. The spacers may be a powdered substance such as BaO, etc., giving the spacers themselves the ability to absorb moisture.

When using spacers, the passivation film 6003 can relieve the spacer pressure. Further, a resin film, etc., can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the cover material 6000. Note that if PVB or EVA is used as the filling material 6004, it is preferable to use a sheet with a structure in which several tens of μm of aluminum foil is sandwiched by a PVF film or a Mylar film.

However, depending upon the light emission direction from the EL device (the light irradiation direction), it is necessary for the cover material 6000 to have light transmitting characteristics.

In addition, the wiring 4016 is electrically connected to the FPC 4017 through the opening between the sealing material 7000, the sealant 7001, and the substrate 4010. Note that an explanation of the wiring 4016 has been made, and the wirings 4014 and 4015 are also connected electrically to the FPC 4017 by similarly passing underneath the sealing material 7000 and the sealant 7001.

In addition, the pixel electrode is used as an anode in embodiment 12, so it is preferable to use a PTFT for the current control TFT. Embodiment 9 may be referred to for the manufacturing process. The light emitted by the light emitting layer is irradiated toward the substrate on which the TFT is formed in embodiment 12. In addition, the NTFT of the present invention may also be used to form the current control TFT. When using an NTFT as the current control TFT, a pixel electrode (EL element cathode) which is formed of a high reflectivity conductive film may connected to the drain of the pixel portion TFT 4023, and an EL layer, and a conductive film having light transparency characteristics which forms an anode may be manufactured in order. In this case, the light generated from the light emitting layer is irradiated toward the substrate on which the TFT is not formed.

Note that the present invention may be realized by freely combining any of the embodiments 1 to 11.

Embodiment 13

A CMOS circuit and a pixel matrix unit formed through carrying out the present invention may be applied to various electro-optical devices (active matrix type liquid crystal displays, active matrix type EL displays, active matrix type EC displays). Namely, the present invention may be carried out in all the electronic equipments that incorporate those electro-optical devices into display units.

As such an electronic equipment, a video camera, a digital camera, a projector (a rear-type or a front-type projector), a head mount display (a goggle-type display), a navigation system for vehicles, a personal computer, and a portable information terminal (a mobile computer, a cellular phone, or an electronic book, etc.) may be enumerated. Examples of those are shown in FIGS. 21A to 21F, 24A to 24D and 25A to 25C.

Figure 21A:
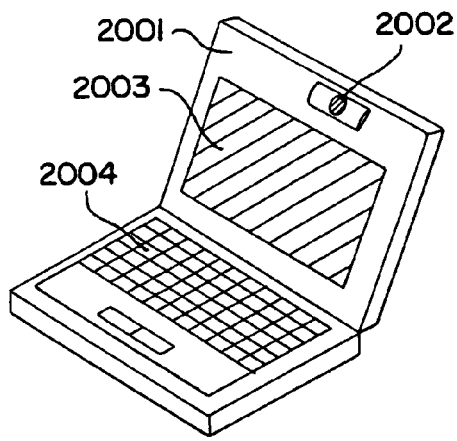
FIGS. 21A to 21F are diagrams showing examples of electronic equipment of Embodiment 13.

FIG. 21A shows a personal computer comprising a main body 2001, an image inputting unit 2002, a display unit 2003, and a key board 2004 and the like. The present invention is applicable to the image inputting unit 2002, the display unit 2003, and other signal control circuits.

Figure 21B:
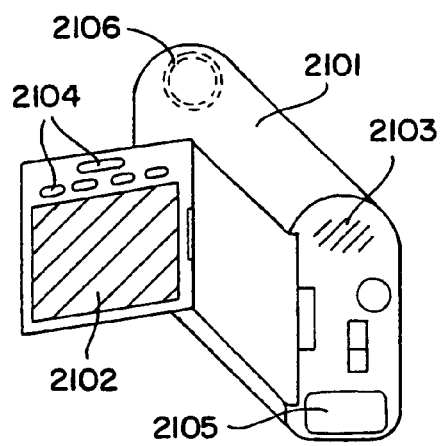

FIG. 21B shows a video camera comprising a main body 2101, a display unit 2102, a voice input unit 2103, operation switches 2104, a battery 2105, and an image receiving unit 2106 and the like. The present invention is applicable to the display unit 2102 and other signal control circuits.

Figure 21C:
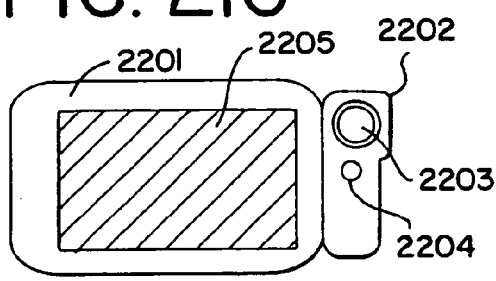

FIG. 21C shows a mobile computer comprising a main body 2201, a camera unit 2202, an image receiving unit 2203, an operation switch 2204, and a display unit 2205 and the like. The present invention is applicable to the display unit 2205 and other signal control circuits.

Figure 21D:
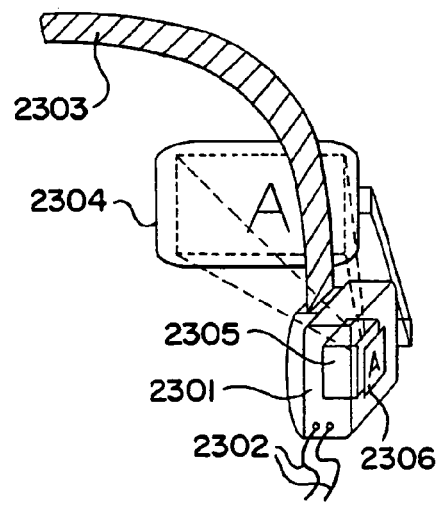

FIG. 21D shows a part (right one side) of a head attachment type EL display comprising a main body 2301, a signal cable 2302, a head fixing band 2303, a display unit 2304, an optical system 2305 and a display device 2306 and the like. The present invention is applicable to the display device 2306.

Figure 21E:
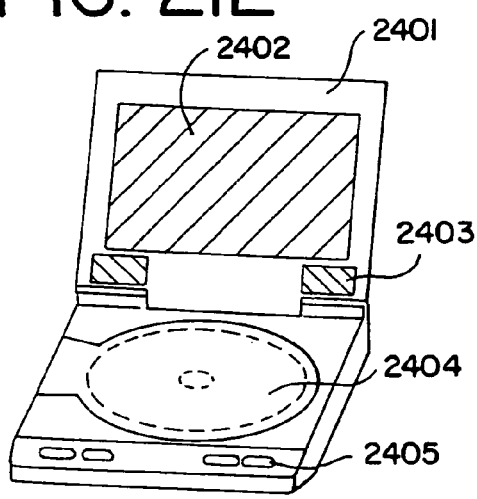

FIG. 21E shows a player that employs a recoding medium in which programs are recorded (hereinafter referred to as recording medium), and comprises a main body 2401, a display unit 2402, a speaker unit 2403, a recording medium 2404, and an operation switch 2405 and the like. Note that this player uses as the recoding medium a DVD (digital versatile disc), a CD and the like to serve as a tool for enjoying music or movies, for playing video games and for connecting to the Internet. The present invention is applicable to the display unit 2402 and other signal control circuits.

Figure 21F:
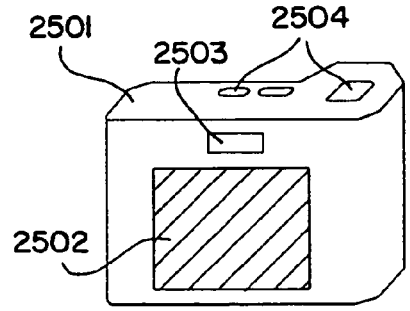
Figure 22A:
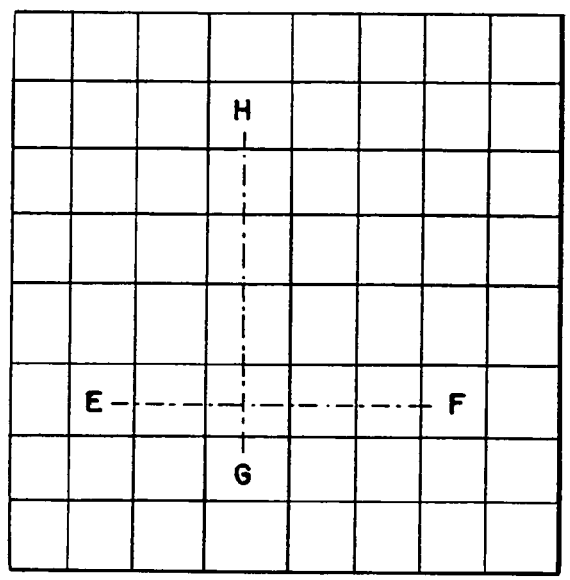
FIGS. 22A to 22C are diagrams showing a surface of a silicon film laser crystallized by a conventional linear shape laser.
Figure 22B:
Figure 22C:
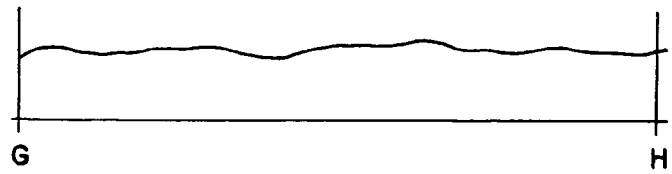

FIG. 21F shows a digital camera comprising a main body 2501, a display unit 2502, an eye piece section 2503, operation switches 2504, and an image receiving unit (not shown) and the like. The present invention is applicable to the display unit 2502 and other signal control circuits.

Figure 24A:
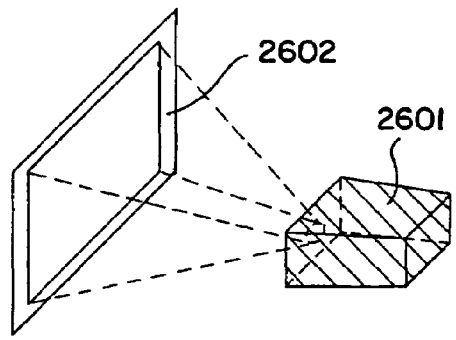
FIGS. 24A to 24D are diagrams showing examples of electronic equipment of Embodiment 13.

FIG. 24A shows a front-type projector comprising a projection device 2601, a screen 2602 and the like. The present invention is applicable to a liquid crystal display device 2808 that constitutes a part of the projection device 2601 and other signal control circuits.

Figure 24B:
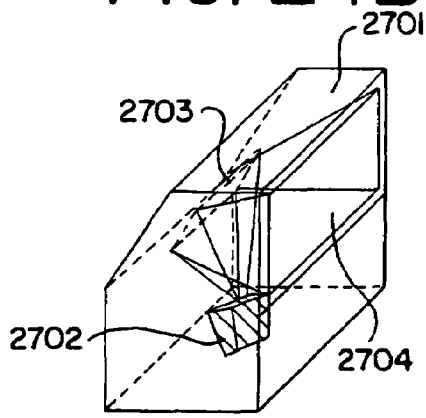

FIG. 24B shows a rear-type projector comprising a main body 2701, a projection device 2702, a mirror 2703, and a screen 2704 and the like. The present invention is applicable to the liquid crystal display device 2808 that constitutes a part of the projection device 2702 and other signal control circuits.

Figure 24C:
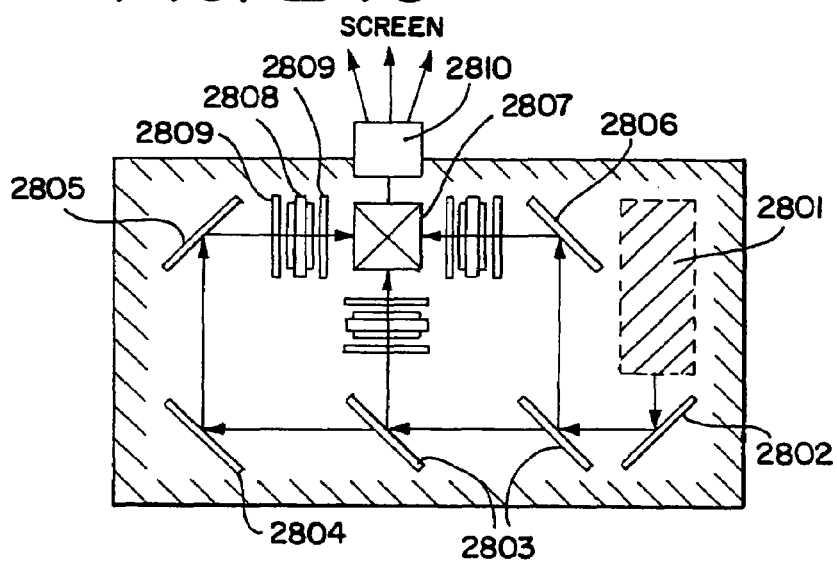

FIG. 24C is a diagram showing an example of the structure of the projection devices 2601 and 2702 in FIGS. 24A and 24B. The projection device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 consists of an optical system including a projection lens. This embodiment shows an example of "three plate type", but not particularly limited thereto. For instance, the invention may be applied also to a "single plate type". Further, in the light path indicated by an arrow in FIG. 24C, an optical system such as an optical lens, a film having a polarization function, a film for adjusting a phase difference and an IR film may be provided on discretion of a person who carries out the invention.

Figure 24D:
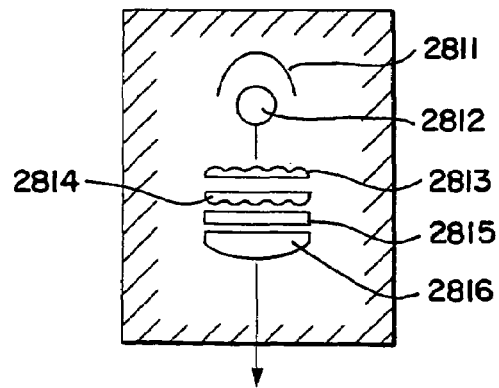

FIG. 24D is a diagram showing an example of the structure of the light source optical system 2801 in FIG. 24C. In this embodiment, the light source optical system 2801 comprises a reflector 2811, light source 2812, lens arrays 2813 and 2814, a polarization conversion element 2815, and a condenser lens 2816. Note that the light source optical system shown in FIG. 24D is an example thereof, and is not particularly limited thereto. For instance, on discretion of a person who carries out the invention, the light source optical system may be provided with an optical system such as an optical lens, a film having a polarization function, a film for adjusting the phase difference and an IR film.

The projectors shown in FIGS. 24A-24D show the case in which the electric optical device of a transmission type is employed and an application example using the electric optical device of reflection type and the EL display device is not illustrated.

Figure 25A:
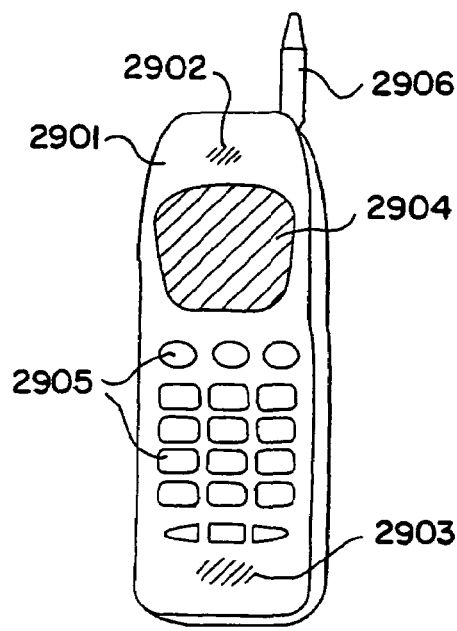
FIGS. 25A to 25C are diagrams showing examples of electronic equipment of Embodiment 13.

FIG. 25A is a cellular phone that is composed of a main body 2901, a voice output unit 2902, a voice input unit 2903, a display unit 2904, operation switches 2905, and an antenna 2906 and the like. The present invention can be applied to the voice output unit 2902, the voice input unit 2903 and the display unit 2904 and other signal control circuits.

Figure 25B:
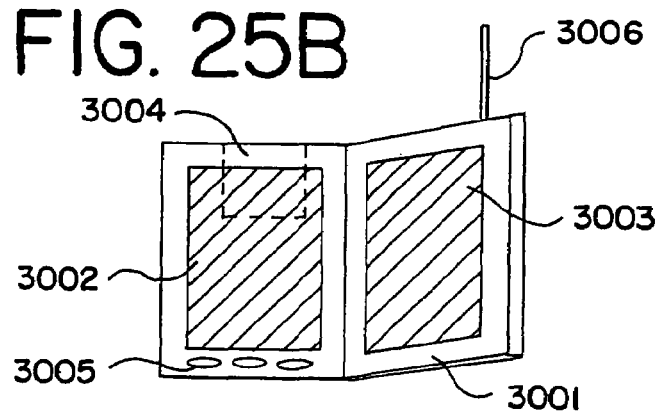

FIG. 25B shows a portable book (electronic book) that is comprised of a main body 3001, display units 3002 and 3003, a memory medium 3004, an operation switch 3005 and an antenna 3006 and the like. The present invention can be applied to the display units 3002 and 3003 and to other signal circuits.

Figure 25C:
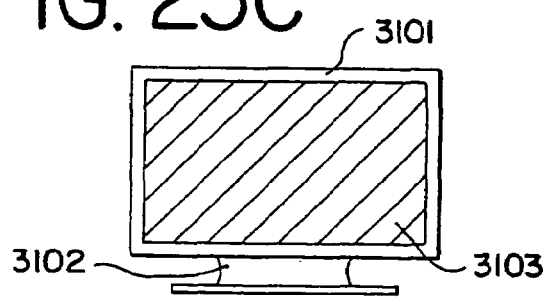

FIG. 25C shows a display that is comprised of a main body 3101, a support base 3102 and a display unit 3103 and the like. The present invention can be applied to the display unit 3103. The display according to the present invention is advantageous in the case where the display is particularly large-sized and in the case where the display is 10 inches or more in an opposite angle (particularly 30 inches or more).

As described above, the present invention has so wide application range that it is applicable to electronic equipments in any field. In addition, the electronic equipments of this embodiment may be realized with any construction obtained by combining Embodiments 1 through 12.

According to the present invention, the uniformity in the surface that is the effect of laser annealing by the laser beam may be improved.

What is claimed is:

1. A method of manufacturing a semiconductor device comprising:
    forming an insulating film over a glass substrate;
    forming a semiconductor film comprising amorphous silicon over the insulating film; and
    irradiating the semiconductor film comprising amorphous silicon with a laser to crystallize the semiconductor film,
    wherein an output power Lw (W) of the laser and a spot size Sp (cm$^2$) on an irradiated surface satisfy the following relationships, $Lw > 1 \times 10^5 Sp$, and $Sp > 2.5 \times 10^{-5}$.

2. The method of manufacturing a semiconductor device according to claim 1, wherein a spot shape of the laser on the irradiated surface is a linear shape.

3. The method of manufacturing a semiconductor device according to claim 1, wherein the insulating film comprises silicon oxide.

4. The method of manufacturing a semiconductor device according to claim 1, wherein the laser is a continuous excimer laser.

5. The method of manufacturing a semiconductor device according to claim 1, further comprising a step of patterning the crystallized semiconductor film into a plurality of semiconductor layers as active layers of thin film transistors.

6. A method of manufacturing a semiconductor device comprising:
    forming an insulating film over a glass substrate;
    forming a semiconductor film comprising amorphous silicon over the insulating film; and
    irradiating the semiconductor film comprising amorphous silicon with a laser to crystallize the semiconductor film,
    wherein an output power Lw (W) of the laser and a spot size Sp (cm$^2$) on an irradiated surface satisfy the following relationships, $Lw > 2 \times 10^5 Sp$, and $Sp > 2.5 \times 10^{-5}$.

7. The method of manufacturing a semiconductor device according to claim 6, wherein a spot shape of the laser on the irradiated surface is a linear shape.

8. The method of manufacturing a semiconductor device according to claim 6, wherein the insulating film comprises silicon oxide.

9. The method of manufacturing a semiconductor device according to claim 6, wherein the laser is a continuous excimer laser.

10. The method of manufacturing a semiconductor device according to claim 6, further comprising a step of patterning the crystallized semiconductor film into a plurality of semiconductor layers as active layers of thin film transistors.

11. A method of manufacturing a semiconductor device comprising:
    forming an insulating film over a glass substrate;
    forming a semiconductor film comprising amorphous silicon over the insulating film; and
    irradiating the semiconductor film comprising amorphous silicon with a laser to crystallize the semiconductor film,
    wherein an output power Lw (W) of the laser and a spot size Sp (cm$^2$) on an irradiated surface satisfy the following relationships, $Lw > 2 \times 10^3 Sp$, and $Sp > 2.5 \times 10^{-5}$.

12. The method of manufacturing a semiconductor device according to claim 11, wherein a spot shape of the laser on the irradiated surface is a linear shape.

13. The method of manufacturing a semiconductor device according to claim 11, wherein the insulating film comprises silicon oxide.

14. The method of manufacturing a semiconductor device according to claim 11, wherein the laser is a continuous excimer laser.

15. The method of manufacturing a semiconductor device according to claim 11, further comprising a step of patterning the crystallized semiconductor film into a plurality of semiconductor layers as active layers of thin film transistors.

16. A method of manufacturing a semiconductor device comprising:
    forming an insulating film over a glass substrate;
    forming a semiconductor film comprising amorphous silicon over the insulating film;
    crystallizing the semiconductor film by heating; and
    irradiating the crystallized semiconductor film with a laser to increase crystallinity thereof,
    wherein an output power Lw (W) of the laser and a spot size Sp (cm$^2$) on an irradiated surface satisfy the following relationships, $$Lw > 1 \times 10^5 Sp, \text{ and}$$

$$Sp > 2.5 \times 10^{-5}.$$

17. The method of manufacturing a semiconductor device according to claim 16, wherein a spot shape of the laser on the irradiated surface is a linear shape.

18. The method of manufacturing a semiconductor device according to claim 16, wherein the insulating film comprises silicon oxide.

19. The method of manufacturing a semiconductor device according to claim 16, wherein the laser is a continuous excimer laser.

20. The method of manufacturing a semiconductor device according to claim 16, further comprising a step of patterning the crystallized semiconductor film into a plurality of semiconductor layers as active layers of thin film transistors after the irradiation of the laser.

21. A method of manufacturing a semiconductor device comprising:
   forming an insulating film over a glass substrate;
   forming a semiconductor film comprising amorphous silicon over the insulating film;
   crystallizing the semiconductor film by heating; and
   irradiating the crystallized semiconductor film with a laser to increase crystallinity thereof,
   wherein an output power Lw (W) of the laser and a spot size Sp (cm$^2$) on an irradiated surface satisfy the following relationships, $$Lw > 2 \times 10^5 Sp, \text{ and}$$

$$Sp > 2.5 \times 10^{-5}.$$

22. The method of manufacturing a semiconductor device according to claim 21, wherein a spot shape of the laser on the irradiated surface is a linear shape.

23. The method of manufacturing a semiconductor device according to claim 21, wherein the insulating film comprises silicon oxide.

24. The method of manufacturing a semiconductor device according to claim 21, wherein the laser is a continuous excimer laser.

25. The method of manufacturing a semiconductor device according to claim 21, further comprising a step of patterning the crystallized semiconductor film into a plurality of semiconductor layers as active layers of thin film transistors after the irradiation of the laser.

26. A method of manufacturing a semiconductor device comprising:
   forming an insulating film over a glass substrate;
   forming a semiconductor film comprising amorphous silicon over the insulating film;
   crystallizing the semiconductor film by heating; and
   irradiating the crystallized semiconductor film with a laser to increase crystallinity thereof,
   wherein an output power Lw (W) of the laser and a spot size Sp (cm$^2$) on an irradiated surface satisfy the following relationships, $$Lw > 2 \times 10^3 Sp, \text{ and}$$

$$Sp > 2.5 \times 10^{-5}.$$

27. The method of manufacturing a semiconductor device according to claim 26, wherein a spot shape of the laser on the irradiated surface is a linear shape.

28. The method of manufacturing a semiconductor device according to claim 26, wherein the insulating film comprises silicon oxide.

29. The method of manufacturing a semiconductor device according to claim 26, wherein the laser is a continuous excimer laser.

30. The method of manufacturing a semiconductor device according to claim 26, further comprising a step of patterning the crystallized semiconductor film into a plurality of semiconductor layers as active layers of thin film transistors after the irradiation of the laser.

* * * * *